US012062648B2

(12) United States Patent
Popovic et al.

(10) Patent No.: US 12,062,648 B2
(45) Date of Patent: Aug. 13, 2024

(54) MULTIPLE (MULTI-) DIE INTEGRATED CIRCUIT (IC) PACKAGES FOR SUPPORTING HIGHER CONNECTION DENSITY, AND RELATED FABRICATION METHODS

(71) Applicant: QUALCOMM Incorporated, San Diego, CA (US)

(72) Inventors: Darko Popovic, San Diego, CA (US); Durodami Lisk, San Diego, CA (US); Yue Li, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 299 days.

(21) Appl. No.: 17/484,475

(22) Filed: Sep. 24, 2021

(65) Prior Publication Data

US 2023/0102167 A1 Mar. 30, 2023

(51) Int. Cl.
*H01L 25/10* (2006.01)
*H01L 23/00* (2006.01)
(Continued)

(52) U.S. Cl.
CPC ...... *H01L 25/105* (2013.01); *H01L 23/49816* (2013.01); *H01L 23/49822* (2013.01);
(Continued)

(58) Field of Classification Search
CPC ............. H01L 25/105; H01L 23/49816; H01L 23/49822
See application file for complete search history.

(56) References Cited

U.S. PATENT DOCUMENTS

2011/0068481 A1 3/2011 Park et al.
2015/0357307 A1 12/2015 Fu et al.
(Continued)

FOREIGN PATENT DOCUMENTS

WO 2012151002 A1 11/2012

OTHER PUBLICATIONS

International Search Report and Written Opinion for International Patent Application No. PCT/US2022/075390, mailed Nov. 22, 2022, 18 pages.

*Primary Examiner* — Errol V Fernandes
(74) *Attorney, Agent, or Firm* — Withrow & Terranova, PLLC

(57) ABSTRACT

Multiple (multi-) die integrated circuit (IC) packages for supporting higher connection density, and related fabrication methods. The multi-die IC package includes split dies that provided in respective die packages that are stacked on top of each other to conserve package area. To support signal routing, including through-package signal routing that extends through the die package, each die package includes vertical interconnects disposed adjacent to their respective dies and coupled to a respective package substrate (and interposer substrate if provided) in the package substrate. In this manner, as an example, through-silicon-vias (TSVs) are not required to be fabricated in the multi-die IC package that extend through the dies themselves to provide signal routing between the respective die packages. In another example, space created between adjacent interposer substrates of stacked die packages, as stood off from each other through the interconnect bumps, provides an area for heat dissipation.

33 Claims, 17 Drawing Sheets

(51) Int. Cl.
*H01L 23/498* (2006.01)
*H01L 25/00* (2006.01)

(52) U.S. Cl.
CPC .............. *H01L 24/16* (2013.01); *H01L 25/50* (2013.01); *H01L 2224/16225* (2013.01)

(56) References Cited

U.S. PATENT DOCUMENTS

2016/0043047 A1* 2/2016 Shim .................. H01L 23/5389
438/126
2016/0260689 A1 9/2016 Meyer et al.

* cited by examiner

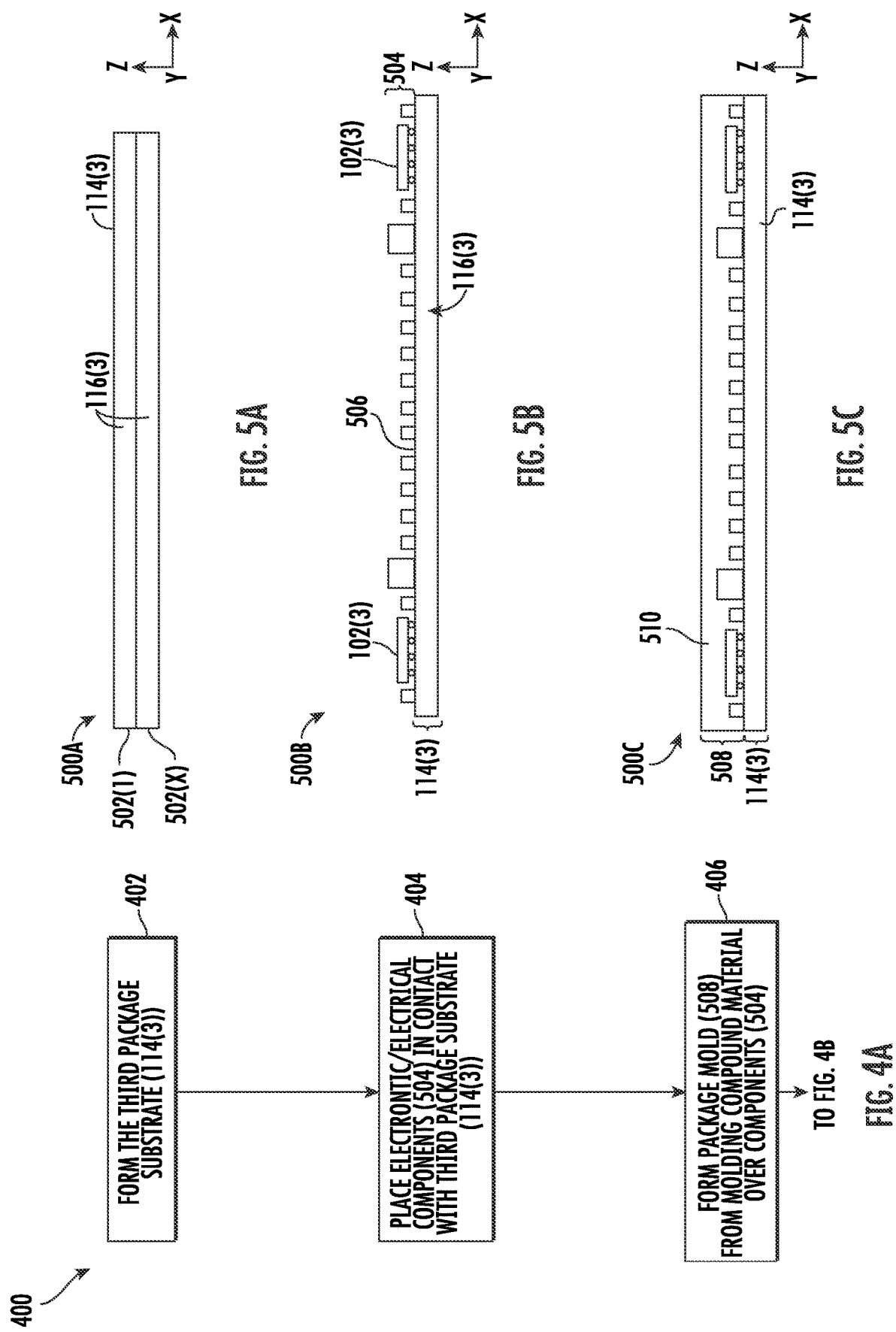

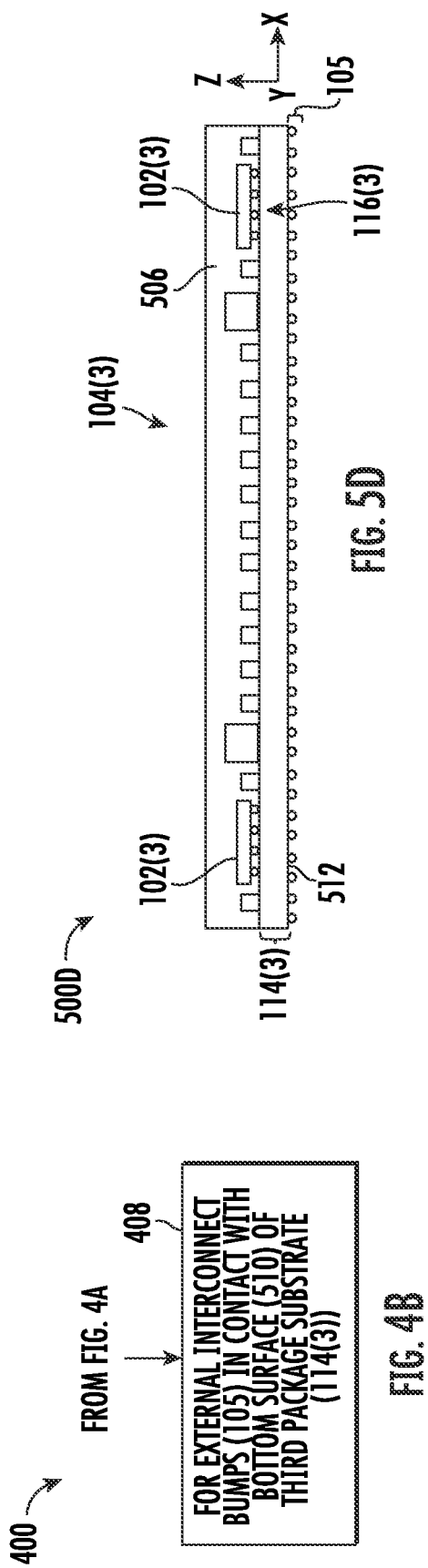

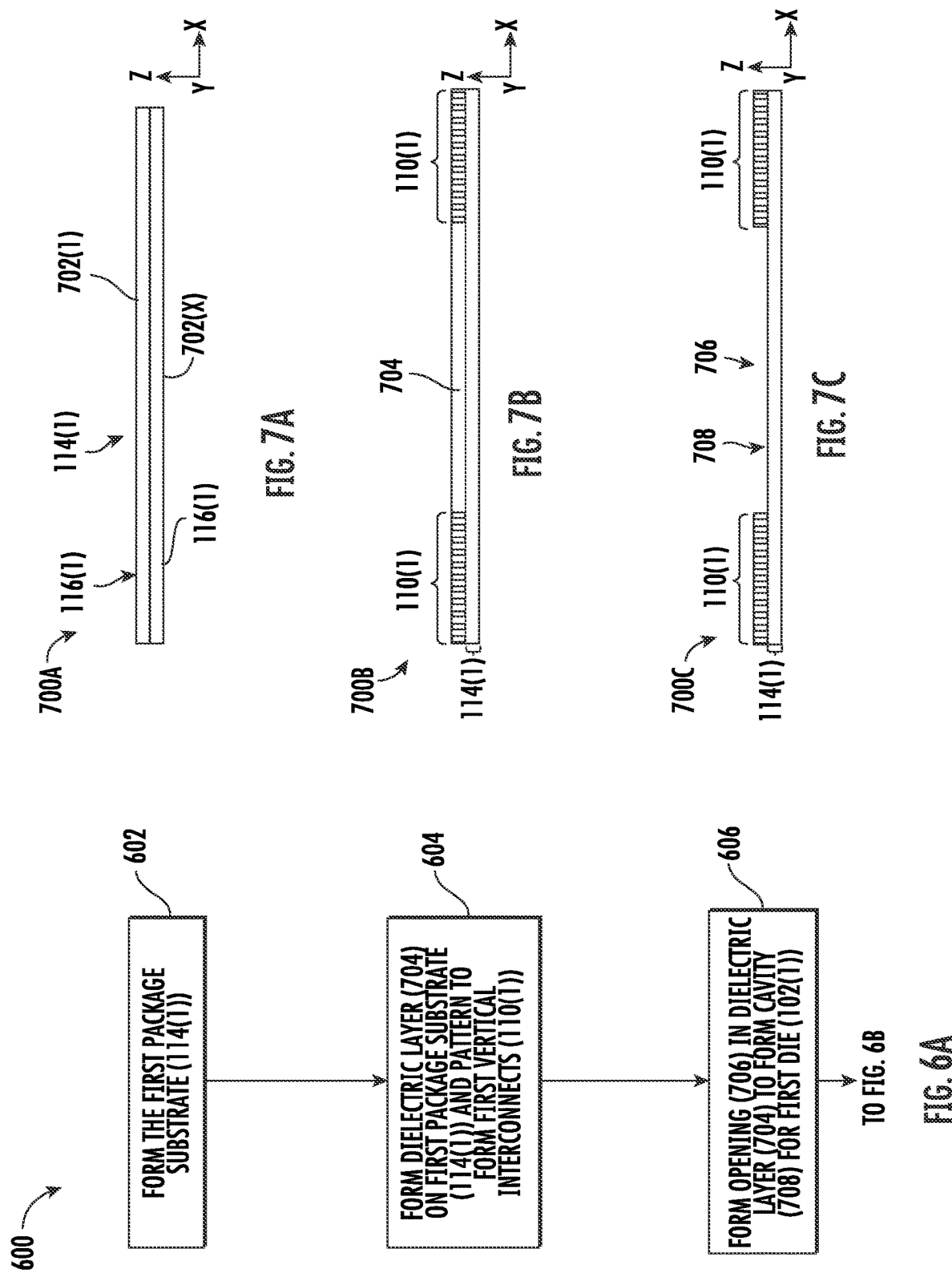

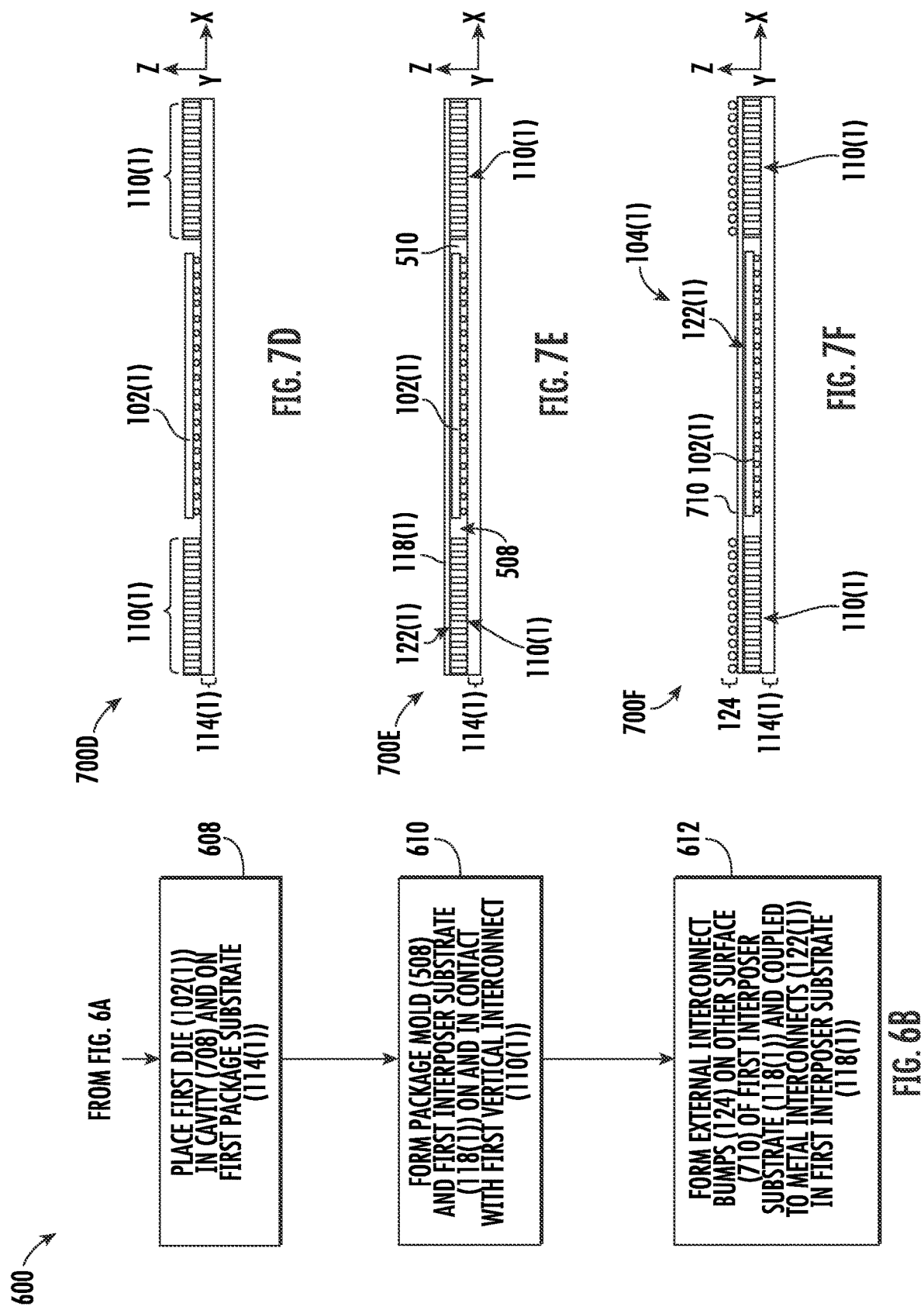

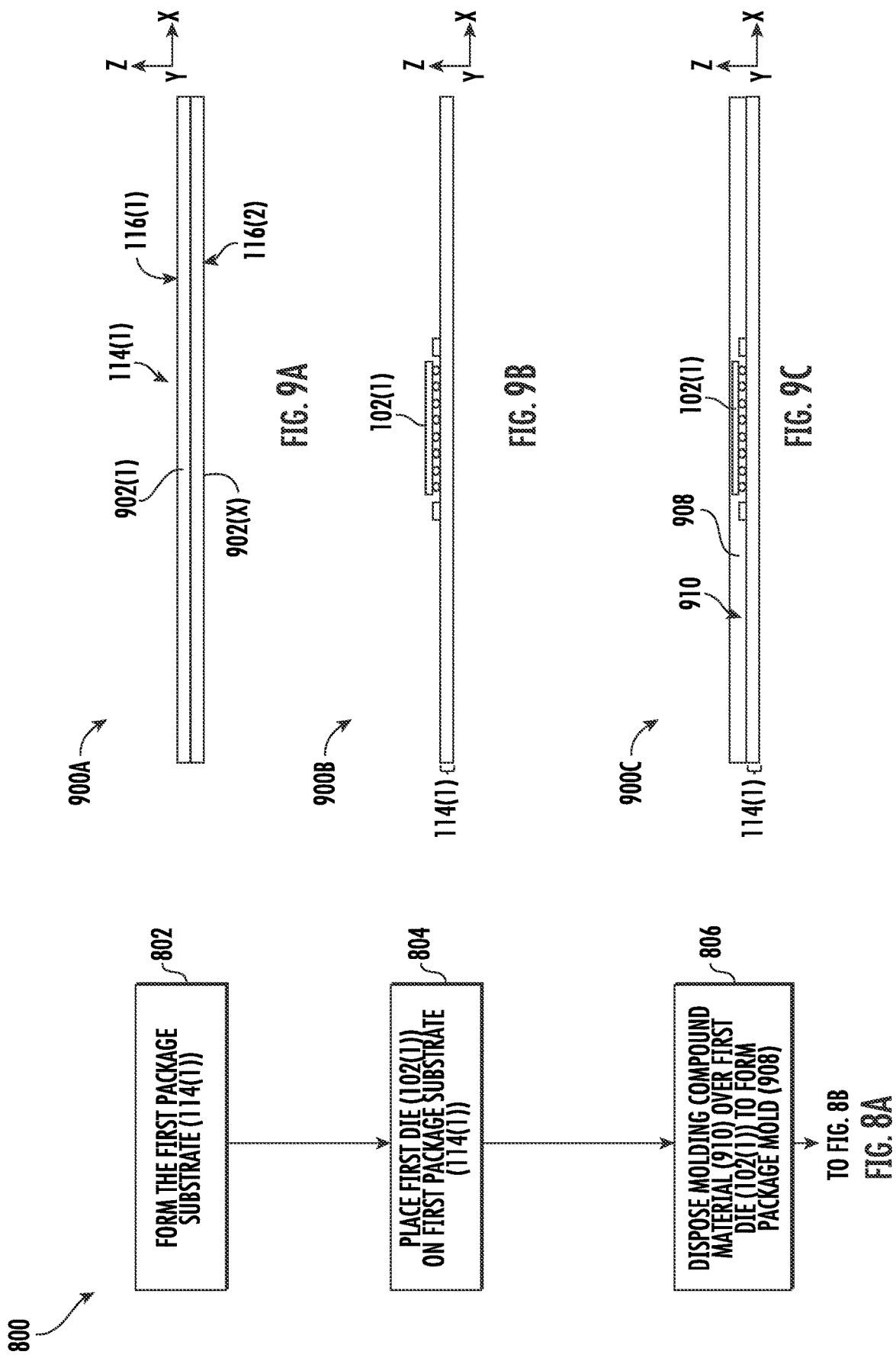

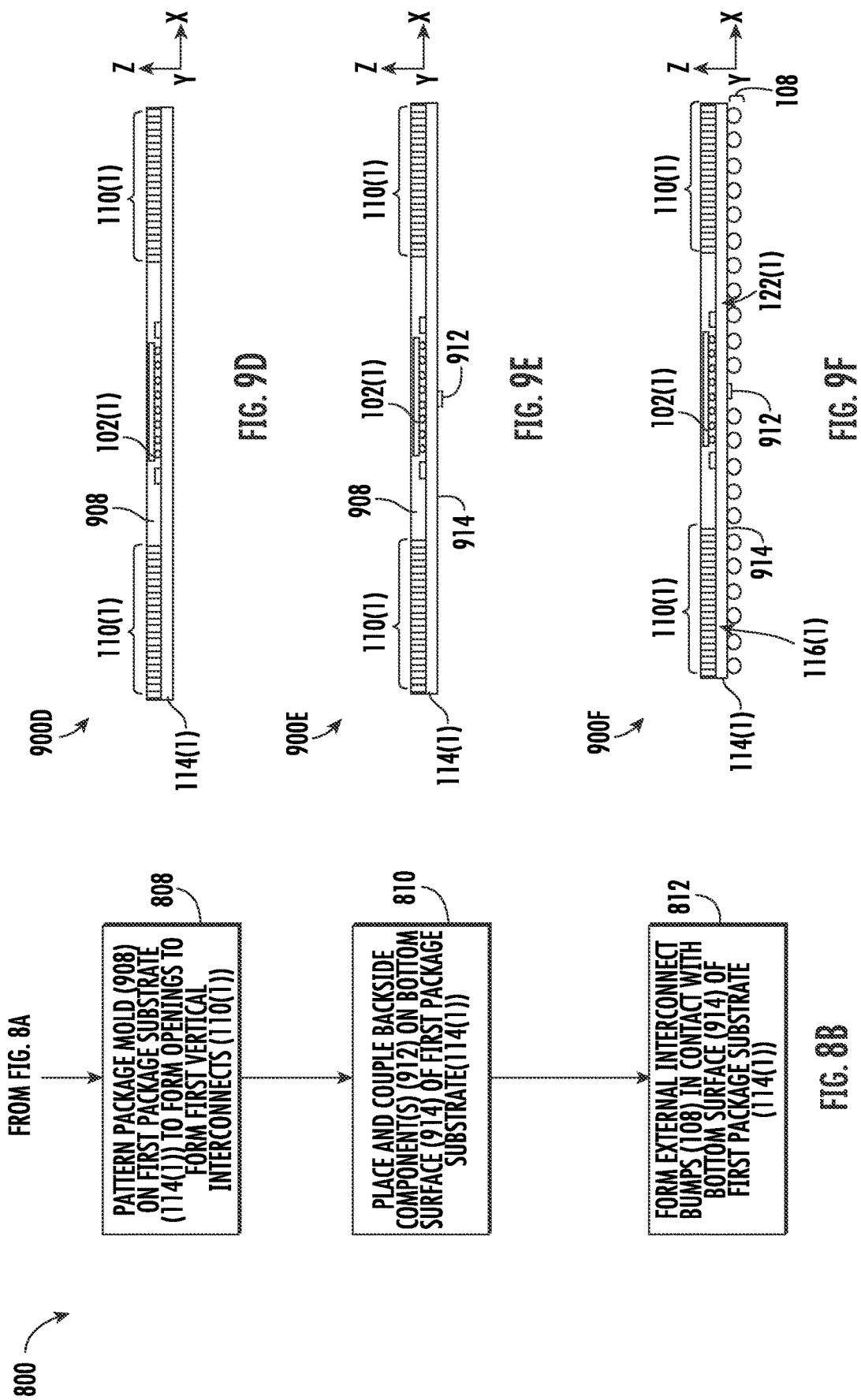

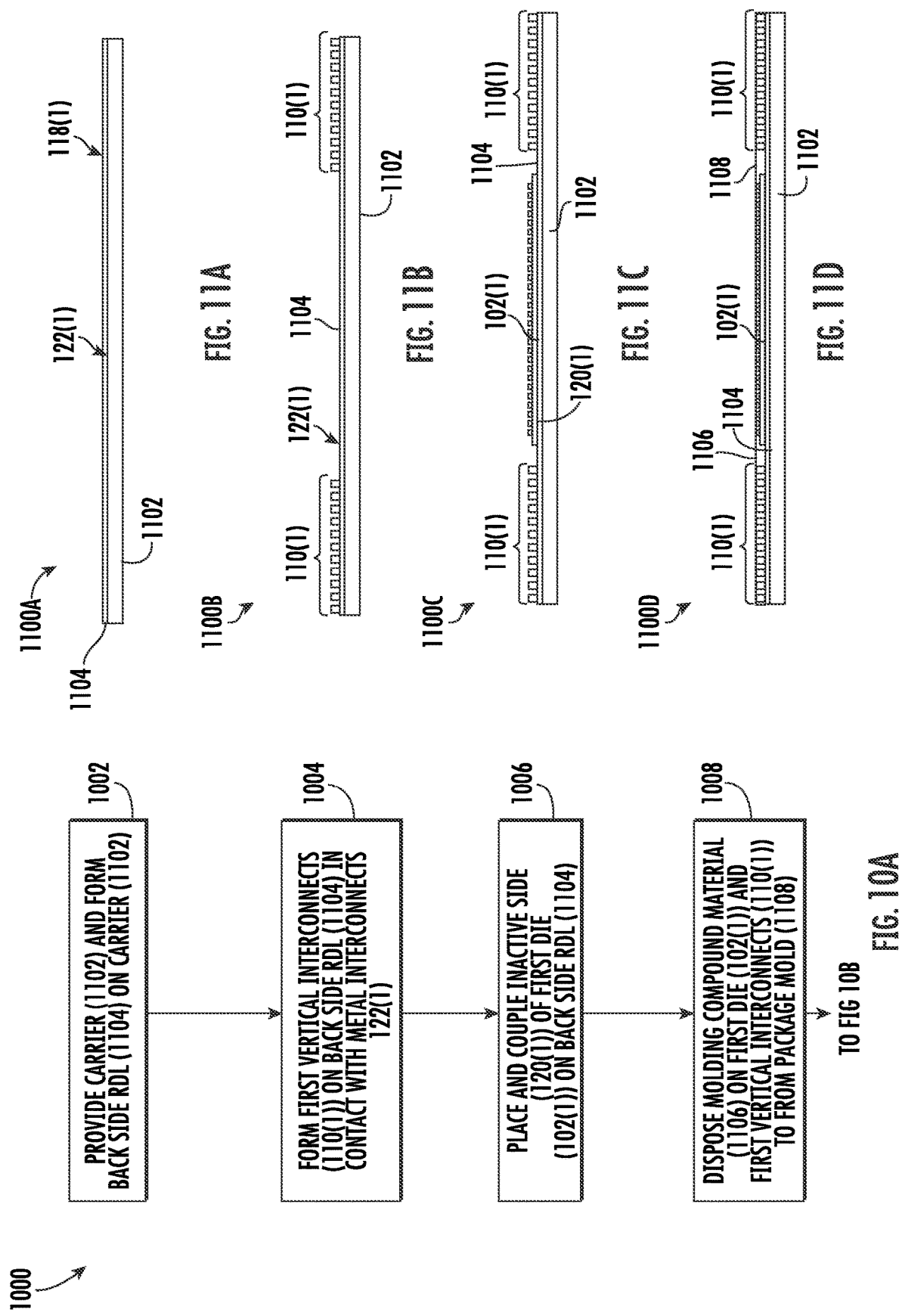

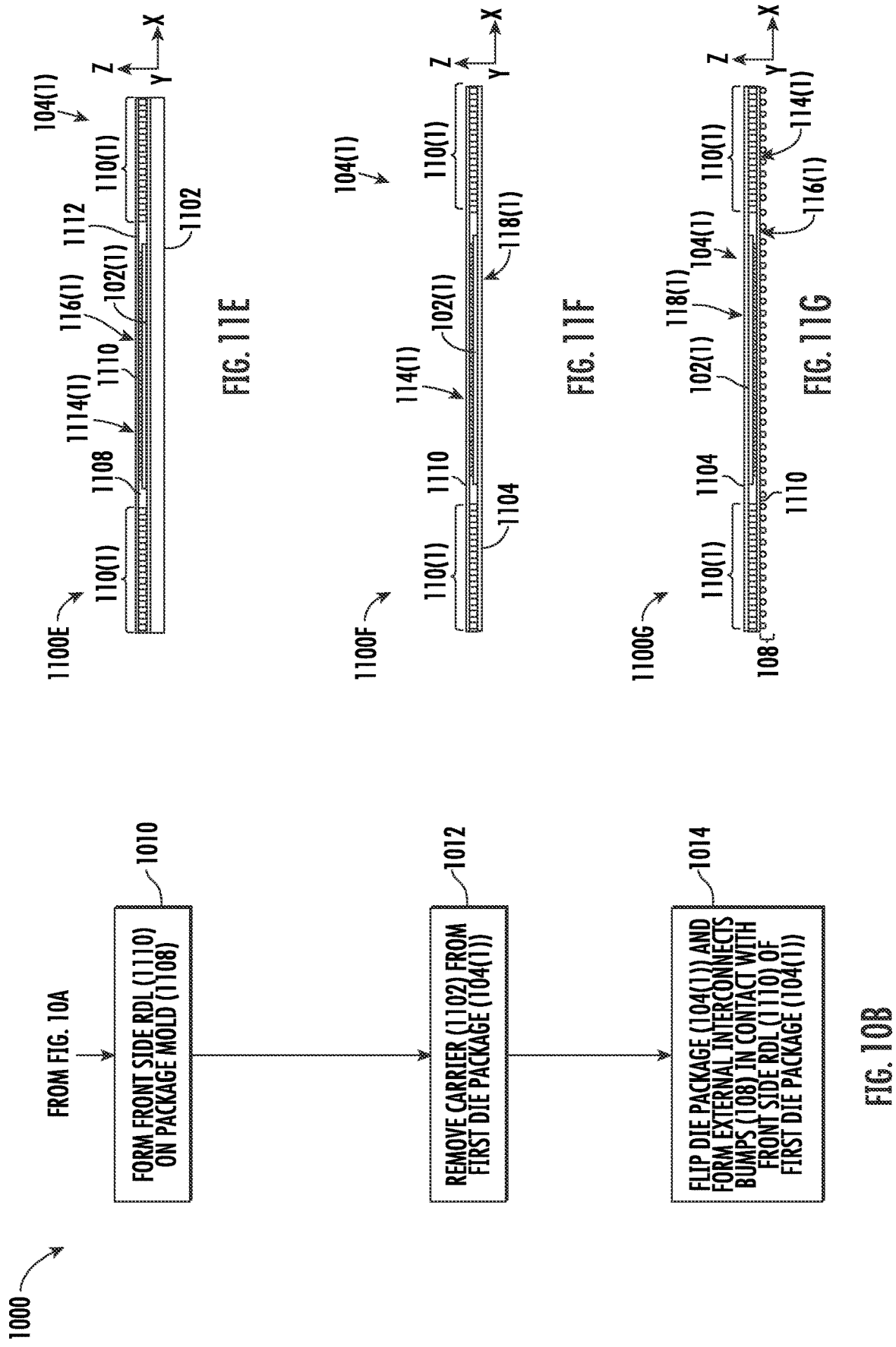

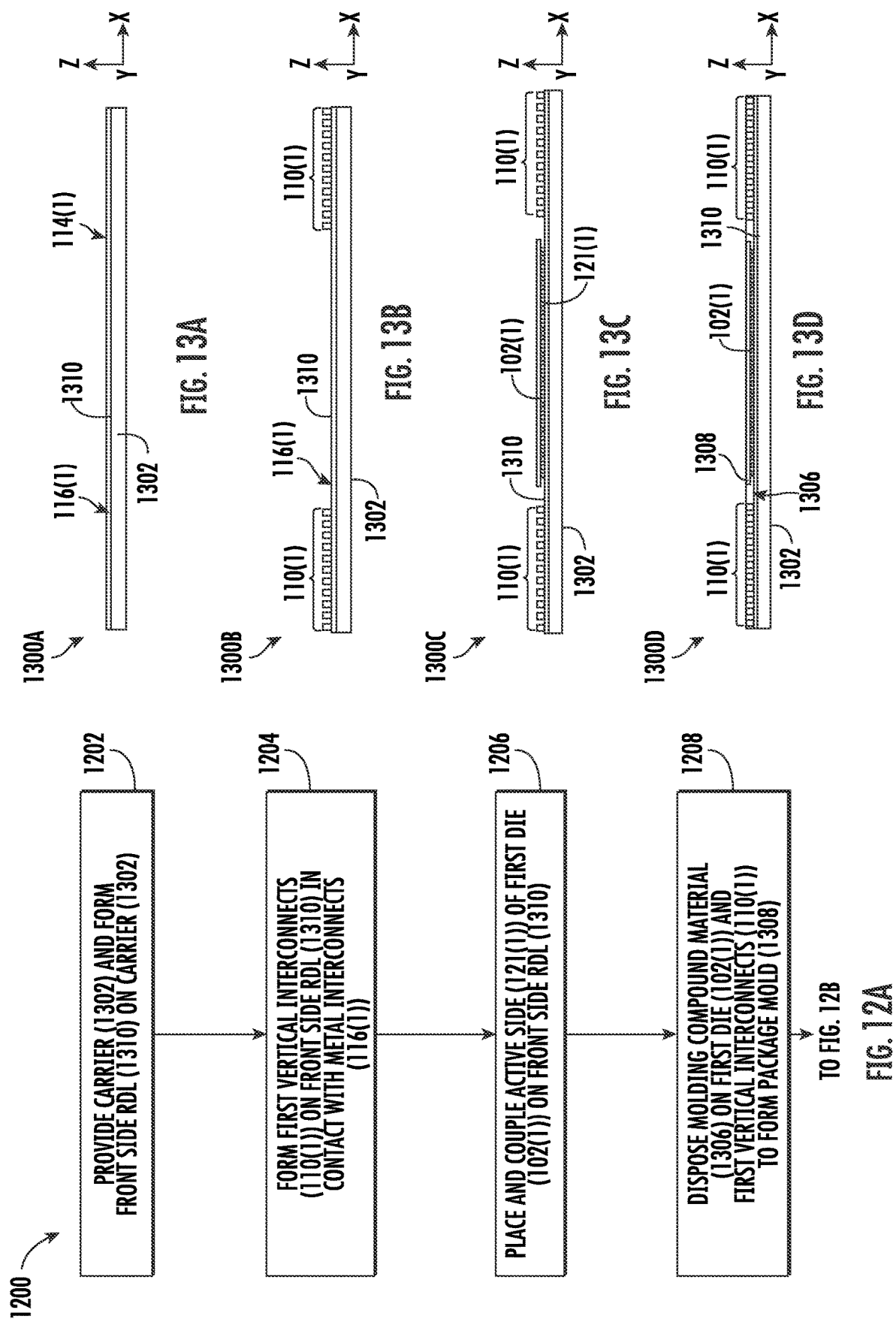

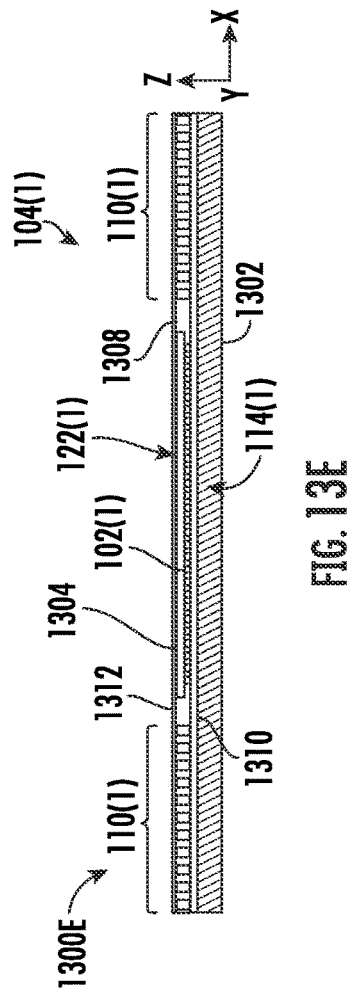
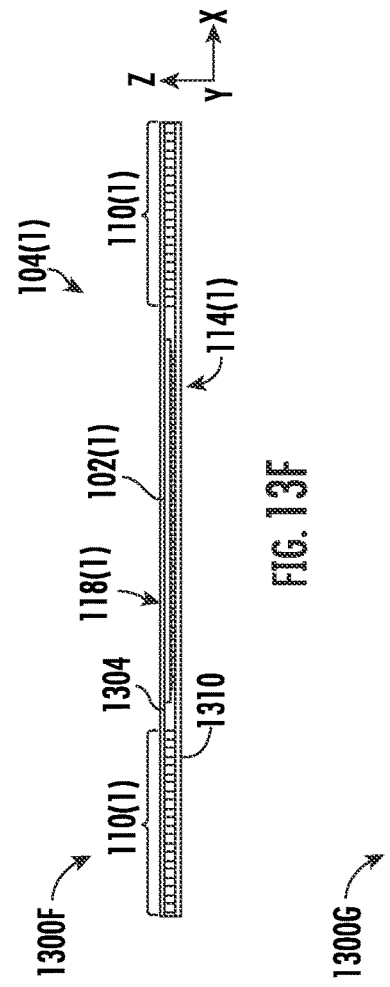
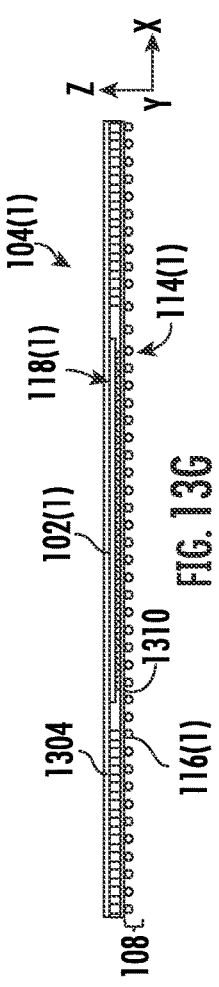
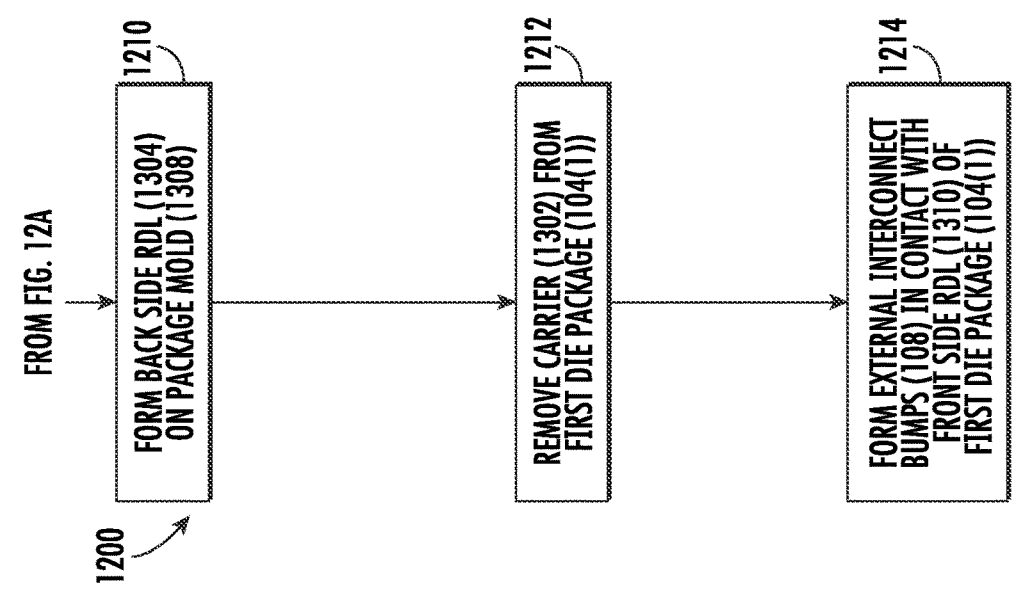

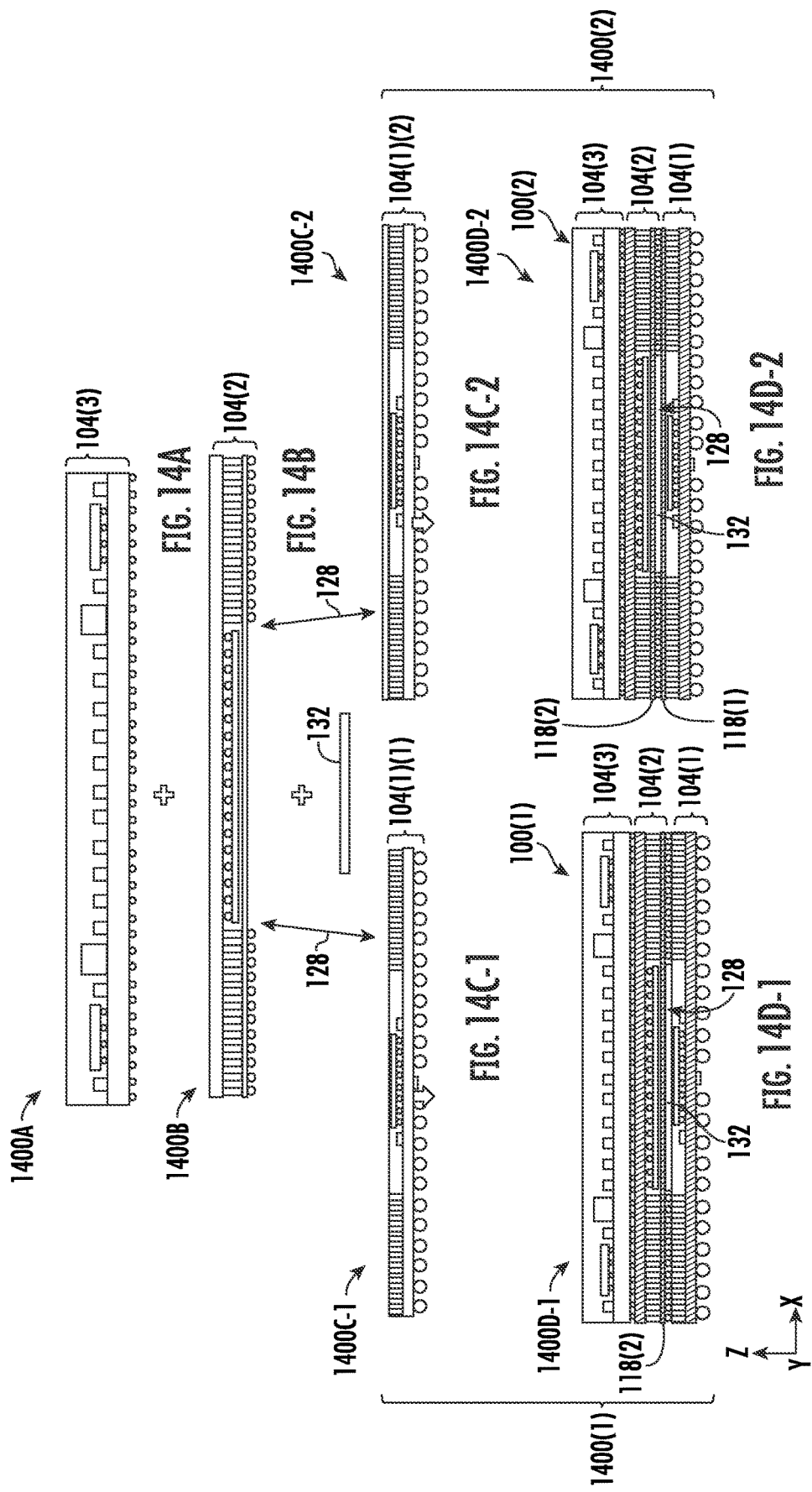

MULTIPLE (MULTI-) DIE INTEGRATED CIRCUIT (IC) PACKAGES FOR SUPPORTING HIGHER CONNECTION DENSITY, AND RELATED FABRICATION METHODS

BACKGROUND

I. Field of the Disclosure

The field of the disclosure relates to integrated circuit (IC) packages, and more particularly to stacked-die IC packages that employ multiple stacked semiconductor die(s) to split circuit applications into multiple dies.

II. Background

Integrated circuits (ICs) are the cornerstone of electronic devices, ICs are typically packaged in an IC package, also called a "semiconductor package" or "chip package." The IC packages can be included in hand-held, battery-powered electronic devices, for example, where reduced package size and reduced power consumption is particularly important. A conventional IC package includes a package substrate and one or more IC chips or other electronic modules mounted to the package substrate to provide electrical connectivity to the IC chips. For example, an IC chip in an IC package may be a system-on-a-chip (SoC), an application processor, or a power management IC. The semiconductor dies ("dies") of the IC chips are electrically coupled to the package substrate through metal interconnects such as in the form of solder bumps or copper pillars, also known as "interconnect bumps" or just "bumps." Metal traces or lines in metallization layers in the package substrate are coupled to the interconnect bumps to route electrical signals external to the IC package as well as to other coupled dies in the IC package.

Some IC packages are known as multiple (multi-) die IC packages, which include multiple dies included in the IC package for different purposes or applications. For example, a multi-die IC package may include a separate power management die and application die. As examples, the application die could be a modem, a processor, or a system-on-a-chip (SoC). The multi-die IC package could also include one or more memory dies that provide memory to support data storage and access by the application die. Splitting major applications/functions into separate dies is an alternative to putting circuits for all such applications/functions into a single die. Fabrication cost and complexity increase disproportionally with larger sized dies. This can result in lower package yields. However, with the splitting of dies in an IC package into multiple dies, the overall size of the IC package may increase in an undesired manner. For example, the size of the IC package may increase due to having to provide sufficient input/output (I/O) signal paths between the dies to provide needed die-to-die (D2D) communications as well to the external interconnects of the IC package for external communications. Minimizing IC package size is highly desired for smaller device applications, such as mobile devices for example.

SUMMARY OF THE DISCLOSURE

Aspects disclosed herein include multiple (multi-) die integrated circuit (IC) packages for supporting higher connection density. Related fabrication methods are also disclosed. The multi-die IC package includes multiple dies to split circuit functionality for the IC package over multiple dies. This is opposed to, for example, providing an increased size single die in an IC package potentially at a greater cost and decreased yield. However, in a multi-die IC package, the overall package size of the IC package may increase as a result of providing multiple dies and other substrate structures to support external and die-to-die (D2D) signal routing. Thus, in exemplary aspects, the IC package includes split dies that are stacked on top of each other (e.g., as package-on-package (POP)) in a vertical direction (e.g., Z-axis direction) to conserve package area in the horizontal direction (e.g., X-/Y-axes directions). The split dies in the multi-die IC package are provided in respective split die packages that are stacked on top of each other. Providing split dies in separate die packages can allow each die package to be fabricated and tested separately before being assembled in the multi-die IC package to increase yield at a lower cost. However, with a split die configuration, a larger number of input/output (I/O) connections may need to be supported for D2D and external signal routing versus a single die package.

In this regard, in another exemplary aspect, to support signal routing, including I/O signal routing, in the multi-die IC package, each die package includes vertical interconnects (e.g., metal pillars, through-mold vertical interconnect accesses (vias) (TMVs)) that are disposed adjacent to their respective dies. The vertical interconnects are coupled to a package substrate in their respective die package to provide signal routing paths to their dies. To provide signal routing paths between the split die packages, the die packages also include an optional interposer substrate. The vertical interconnects in each respective die package are coupled to their respective package substrate (and interposer substrate if provided) to provide signal routing that is adjacent to the die in the die package and extend through the die package. Thus, the vertical interconnects in the die packages being disposed adjacent to their die and coupled to their package substrate (and interposer substrate if provided) provides through-connections through the die packages to support interconnections in the multi-die IC package. In this manner, as an example, through-silicon-vias (TSVs) are not required to be fabricated in the multi-die IC package that extend through the dies themselves to provide signal routing between the respective die packages.

In one example, the die packages in the multi-die IC package are oriented such that the inactive sides of their respective dies face each other in a back-to-back configuration. The die in each die package is coupled to a respective package substrate that is disposed adjacent to the active side of the die. An interposer substrate can be provided in any of the die packages to facilitate providing an electrical interface between vertical interconnects in a respective die package and external interconnects coupling its die package to another die package. In one example, if the interposer substrate is provided in a die package, the interposer substrate is disposed adjacent to the inactive side of the die in its respective package substrate. Thus, the die in each die package is disposed between the package substrate and the interposer substrate (if provided) of its die package. Metal interconnects in metallization layers in the package substrate of a given die package are coupled to vertical interconnects located adjacent to the dies. The vertical interconnects extend through the die package and are coupled to metal interconnects in metallization layers of the interposer substrate, if provided, of the die module disposed on the opposite side from the package substrate. Alternatively, the vertical interconnect could extend to a second outer surface of the die package opposite of the package substrate. The vertical interconnections provided in the die packages support through-connections through the die packages to support interconnections in the multi-die IC package, and without having to employ TSVs, as an example.

In another example, each die package in the multi-die IC package is disposed adjacent to each other in stacked configuration in a vertical direction with interconnect bumps (e.g., solder balls) disposed therebetween to electrically couple the die packages and their vertical interconnects together and to provide interconnections and signal paths between the vertical interconnects in each die package. For example, if the die packages include interposer substrates, the interposer substrates of the die packages would be disposed adjacent to each other and connected through the interconnect bumps. This arrangement may allow for a smaller pitch of the vertical interconnects in the die packages, because the vertical interconnects provided in each die package and coupled to each other, have a smaller aspect ratio than if separate first and second die packages were not provided, where the vertical interconnects would have a larger aspect ratio. Also, the space created between the stacked die packages disposed adjacent to each other in their separate die modules, as stood off from each other through the interconnect bumps, also provides an area for heat dissipation. A thermally conductive material or the air disposed between the space created adjacent to the stacked die packages creates a thermal path for heat dissipation. Thus, by this thermal interface space being adjacent to both die packages, it is shared by both die packages for heat dissipation, which may conserve space needed otherwise in the multi-die IC package for thermal management.

In this regard, in one exemplary aspect, a multi-die IC package is provided. The multi-die IC package comprises a first die package. The first die package comprises a first package substrate. The first die package also comprises a first die coupled to the first package substrate. The first die package also comprises a plurality of first vertical interconnects disposed adjacent to the first die in a horizontal direction, each of the plurality of first vertical interconnects coupled to the first package substrate. The multi-die IC package also comprises a second die package adjacent to the first die package in the vertical direction. The second die package comprises a second package substrate. The second die package also comprises a second die coupled to the second package substrate. The second die package also comprises a plurality of second vertical interconnects disposed adjacent to the second die in the horizontal direction, each of the plurality of second vertical interconnects coupled to the second package substrate.

In another exemplary aspect, a method of fabricating a multi-die IC package is provided. The method comprises forming a first die package, which comprises providing a first package substrate, providing a first die, coupling the first die to the first package substrate in a vertical direction, and forming a plurality of first vertical interconnects coupled to the first package substrate and disposed adjacent to the first die in a horizontal direction. The method also comprises forming a second die package, which comprises providing a second package substrate, providing a second die, coupling the second die to the second package substrate in the vertical direction, and forming a plurality of second vertical interconnects coupled to the second package substrate and disposed adjacent to the second die in the horizontal direction. The method also comprises coupling the second die package to the first die package in the vertical direction.

BRIEF DESCRIPTION OF THE FIGURES

FIGS. 4A and 4B is a flowchart illustrating another exemplary fabrication process of fabricating the exemplary upper die package in the multi-die IC package in FIG. 1;

FIGS. 5A-5D are exemplary fabrication stages during fabrication of the upper die package in the multi-die IC package in FIG. 1, and according to the fabrication process in FIGS. 4A and 4B;

FIGS. 6A and 6B is a flowchart illustrating another exemplary fabrication process of fabricating a die package among the split die packages in the multi-die IC package in FIG. 1;

FIGS. 7A-7F are exemplary fabrication stages during fabrication of a die package among the split die packages in the multi-die IC package in FIG. 1, and according to the fabrication process in FIGS. 6A and 6B;

FIGS. 8A and 8B is a flowchart illustrating an alternative option for an exemplary fabrication process of fabricating a die package among the split die packages in the multi-die IC package in FIG. 1;

FIGS. 9A-9F are exemplary fabrication stages during fabrication of a die package among the split die packages in the multi-die IC package in FIG. 1, and according to the fabrication process in FIGS. 8A and 8B;

FIGS. 10A and 10B is a flowchart illustrating a second alternative option for an exemplary fabrication process of fabricating a die package among the split die packages in the multi-die IC package in FIG. 1;

FIGS. 11A-11G are exemplary fabrication stages during fabrication of a die package among the split die packages in the multi-die IC package in FIG. 1, and according to the fabrication process in FIGS. 10A and 10B;

FIGS. 12A and 12B is a flowchart illustrating a third alternative option for an exemplary fabrication process of fabricating a die package among the split die packages in the multi-die IC package in FIG. 1;

FIGS. 13A-13G are exemplary fabrication stages during fabrication of a die package among the split die packages in the multi-die IC package in FIG. 1, and according to the fabrication process in FIGS. 12A and 12B;

FIGS. 14A and 14B are exemplary assembly stages of a stacking assembly process of the two (2) upper die packages in the multi-die IC package in FIG. 1;

FIGS. 14C-1 and 14D-1 is an exemplary assembly of a first stacking assembly process the stacked die package resulting from the stacking assembly process in FIGS. 14A and 14B, on a third, bottom die package in FIG. 1;

FIGS. 14C-2 and 14D-2 is an exemplary assembly of a second stacking assembly process the stacked die package resulting from the stacking assembly process in FIGS. 14A and 14B, on a third, bottom die package in FIG. 1;

DETAILED DESCRIPTION

Figure 1:
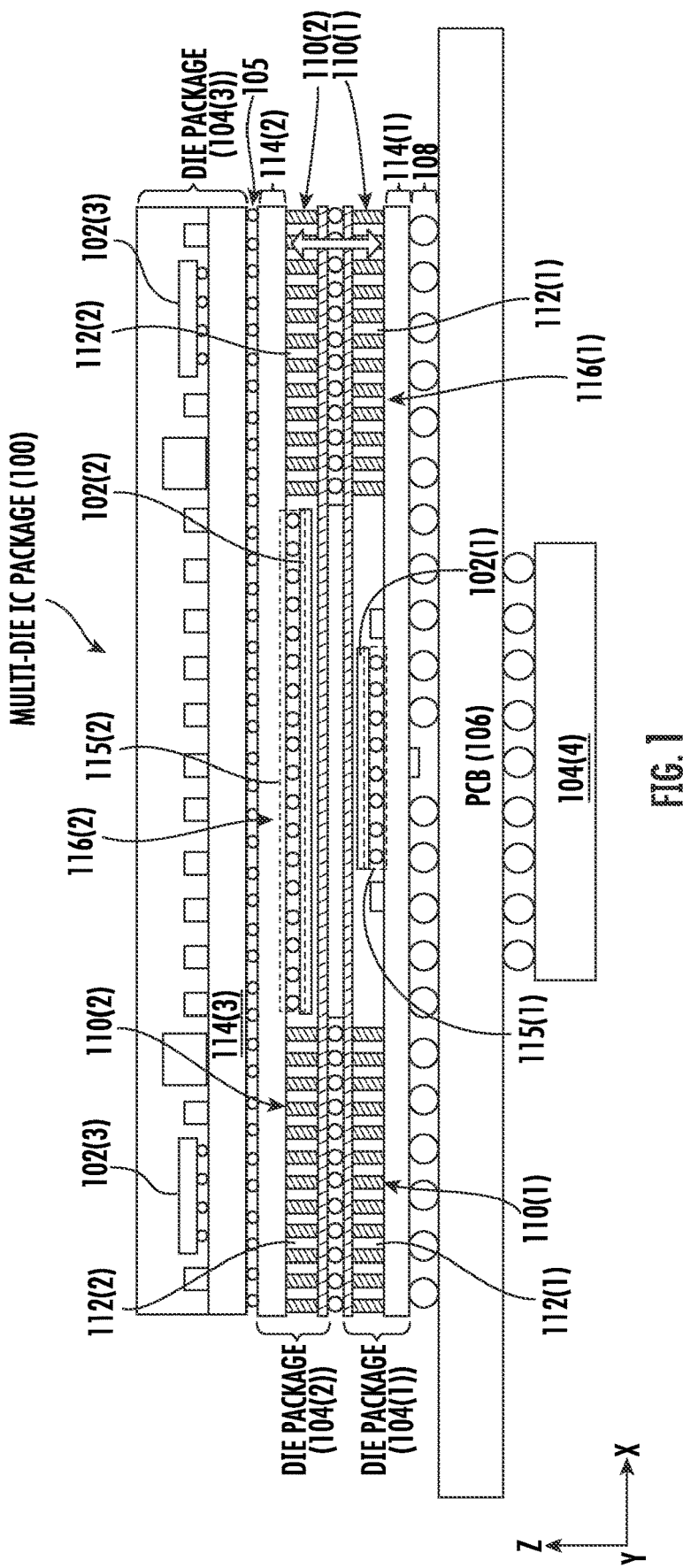
FIG. 1 is a side view of an exemplary multiple (multi-) die integrated circuit (IC) package that includes split dies provided in respective, separate die packages, wherein each die package includes a vertical interconnect disposed adjacent to its respective die to provide through-connections through the die package for interconnections for signal routing.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multiple (multi-) die integrated circuit (IC) packages for supporting higher connection density. Related fabrication methods are also disclosed. The multi-die IC package includes multiple dies to split circuit functionality for the IC package over multiple dies. This is opposed to, for example, providing an increased size single die in an IC package potentially at a greater cost and decreased yield. However, in a multi-die IC package, the overall package size of the IC package may increase as a result of providing multiple dies and other substrate structures to support external and die-to-die (D2D) signal routing. Thus, in exemplary aspects, the IC package includes split dies that are stacked on top of each other (e.g., as package-on-package (POP)) in a vertical direction (e.g., Z-axis direction) to conserve package area in the horizontal direction(s) (e.g., X-/Y-axes direction(s)). The split dies in the multi-die IC package are provided in respective split die packages that are stacked on top of each other. Providing split dies in separate die packages can allow each die package to be fabricated and tested separately before being assembled in the multi-die IC package to increase yield at a lower cost. However, with a split die configuration, a larger number of input/output (I/O) connections may need to be supported for D2D and external signal routing versus a single die package.

In this regard, in another exemplary aspect, to support signal routing, including I/O signal routing, in the multi-die IC package, each die package includes vertical interconnects (e.g., metal pillars, through-mold vertical interconnect accesses (vias) (TMVs)) that are disposed adjacent to their respective dies. The vertical interconnects are coupled to a package substrate in their respective die package to provide signal routing paths to their dies. To provide signal routing paths between the split die packages, the die packages also include an optional interposer substrate. The vertical interconnects in each respective die package are coupled to their respective package substrate (and interposer substrate if provided) to provide signal routing that is adjacent to the die in the die package and extend through the die package. Thus, the vertical interconnects in the die packages being disposed adjacent to their die and coupled to their package substrate (and interposer substrate if provided) provides through-connections through the die packages to support interconnections in the multi-die IC package. In this manner, as an example, through-silicon-vias (TSVs) are not required to be fabricated in the multi-die IC package that extend through the dies themselves to provide signal routing between the respective die packages.

In this regard, FIG. 1 is a side view of an exemplary multi-die integrated circuit (IC) package 100 that includes split dies as first and second dies 102(1), 102(2) provided in respective first and second die packages 104(1), 104(2). The split first and second dies 102(1), 102(2) are provided to split circuit functionality for the multi-die IC package 100 over multiple dies. For example, the first and second dies 102(1), 102(2) may be application dies (e.g., a modem or a processor) for the multi-die IC package 100. This is opposed to, for example, providing an increased size, single die that includes the circuits and/or functionality that would otherwise be split among the first and second dies 102(1), 102(2) if provided in the multi-die IC package 100 in FIG. 1. Even though splitting circuits into multiple dies adds an extra die(s) in a package, single larger sized dies may be disproportionally more expensive to fabricate and also have reduced yields. In this example, the multi-die IC package 100 also includes an optional third die package 104(3) that includes third dies 102(3). For example, the dies 102(3) may be power-management integrated circuit (PMIC) dies that provide power management for the first and second dies 102(1), 102(2). The third die package 104(3) includes a third package substrate 114(3) coupled to the third dies 102(3) and to the second die package 104(2) through external interconnect bumps 105. Alternatively, the second package substrate 114(2) of the second die package 104(2) could be integrated with a third package substrate 114(3) of the third die package 104(3) to conserve height in the vertical direction (Z-axis direction). However, this may increase the stress imparted on second die interconnects 115(2) coupling the second die 102(2) to the second package substrate 114(2). The first die package 104(1) is coupled to a printed circuit board (PCB) 106 through external interconnect bumps 108 (e.g., solder bumps, ball grid arrays (BGAs), land grid arrays (LGAs)) that provide external connections to the multi-die IC package 100. Another optional additional die package 104(4) that is coupled to the opposite side of the PCB 106 from the multi-die IC package 100. For example, the die package 104(4) may be a dynamic random access memory (DRAM) chip.

Even though splitting circuit functionality over the split dies 102(1), 102(2) in the multi-die IC package 100 can increase the overall size of the multi-die IC package 100 to accommodate additional connections (e.g., I/O and/or power connections), to provide die-to-die (D2D) connections for example, fabricating the circuits in the split dies 102(1), 102(2) into a single die may be disproportionately more complex and costly. However, in this example, the increased size of the multi-die IC package by providing the split dies 102(1), 102(2) is mitigated or offset by stacking the dies 102(1), 102(2) on top of each other in their respective die packages 104(1), 104(2) in the vertical direction (Z-axis direction) (e.g., as package-on-package (POP)) to conserve area in the horizontal direction(s) (X- and Y-axes direction(s)). The third die package 104(3) is stacked above and coupled to the second die package 104(2) in the vertical direction. In this regard, the multi-die IC package 100 in FIG. 1 is a stacked-die IC package. The split first and second dies 102(1), 102(2) are also provided in their own separate and respective die packages 104(1), 104(2) that are stacked in the vertical direction. Providing the split first and second dies 102(1), 102(2) in the separate die packages 104(1), 104(2) can allow each die package 104(1), 104(2) to be fabricated and tested separately before being assembled in the multi-die IC package 100, to increase yield at a lower cost. However, with a split die configuration of the multi-die IC package 100, a larger number of I/O connections may need to be supported for D2D and external I/O connections for I/O signal routing versus a single die package.

In this regard, to support connections, including I/O connections and/or power connections, for D2D and external signal routing in the multi-die IC package 100 in FIG. 1, the first and second die packages 104(1), 104(2) each include respective first and second vertical interconnects 110(1), 110(2). The first and second vertical interconnects 110(1), 110(2) can be metal pillars or metal through-mold vertical interconnect accesses (vias) (TMVs) (that extend through package mold 112(1), 112(2) of the first and second die packages 104(1), 104(2)), as examples. The first and second vertical interconnects 110(1), 110(2) are disposed adjacent to their respective first and second dies 102(1), 102(2). For example, the first and second vertical interconnects 110(1), 110(2) can be disposed around all sides of the respective first and second dies 102(1), 102(2) in their respective die packages 104(1), 104(2).

With regard to the first die package 104(1), the first vertical interconnects 110(1) in the first die package 104(1) are coupled through first die interconnects 115(1) to a first package substrate 114(1) in the first die package 104(1) to provide connections (e.g., I/O and/or power connections) for signal routing paths to the first die 102(1). The first package substrate 114(1) could be a coreless or cored substrate. The first package substrate 114(1) could be comprised of laminated substrate layers with metallization layers and metal interconnects 116(1) (e.g., metal traces, metal lines) disposed therein, as an example. The first package substrate 114(1) could be comprised of redistributed layers (RDLs) with redistributed metal lines or traces formed in metallization layers therein to form metal interconnects 116(1), as another example. The first package substrate 114(1) could include an embedded trace substrate (ETS) layer(s) with metal interconnects 116(1) (traces) embedded in a metal layer(s), as yet another example. The first die 102(1) is disposed adjacent to, and also coupled to, the first package substrate 114(1) that contains metallization layers with the metal interconnects 116(1) to provide signal routing to the first die 102(1). The first vertical interconnect 110(1) being coupled to the first package substrate 114(1) provides connections between the first package substrate 114(1) and the first vertical interconnects 110(1). In this manner, connections are provided by the first die 102(1), through the first package substrate 114(1), to the first vertical interconnects 110(1). The first vertical interconnects 110(1) extend through the first die package 104(1) in a vertical direction. In this manner, the first vertical interconnects 110(1) can be extended to be coupled to the second die package 104(2), and to its second vertical interconnects 110(2), to provide signal routing between the first and second die packages 104(1), 104(2) and their respective first and second dies 102(1), 102(2).

Similarly, with regard to the second die package 104(2), the second vertical interconnect 110(2) in the second die package 104(2) is coupled through the second die interconnects 115(2) to a second package substrate 114(2) in the second die package 104(2) to provide connections for signal routing paths to the second die 102(2). The second package substrate 114(2) could be comprised of laminated substrate layers with metallization layers and metal interconnects 116(2) (e.g., metal traces, metal lines) disposed therein, as an example. The second package substrate 114(2) could be comprised of RDLs with redistributed metal lines or traces formed in metallization layers therein to form second metal interconnects 116(2), as another example. The second package substrate 114(2) could include an ETS layer(s) with second metal interconnects 116(2) (traces) embedded in a metal layer(s), as yet another example. The second die 102(2) is disposed adjacent to and is also coupled to the second package substrate 114(2) that contains metallization layers with metal interconnects to provide signal routing to the second die 102(2). The second vertical interconnects 110(2) are coupled to the second package substrate 114(2), thus providing connections between the second package substrate 114(2) and the second vertical interconnects 110(2). In this manner, connections are provided by the second die 102(2), through the second package substrate 114(2), to the second vertical interconnects 110(2). The second vertical interconnects 110(2) extend through the second die package 104(2) in a vertical direction. In this manner, the second vertical interconnects 110(2) can be extended to be coupled to the first die package 104(1), and its first vertical interconnects 110(1), to provide signal routing between the first and second die packages 104(1), 104(2) and their respective first and second dies 102(1), 102(2).

In this manner, as discussed above, the first and second vertical interconnects 110(1), 110(2) disposed in the first and second die packages 104(1), 104(2) of the multi-die IC package 100 allow connections to be provided between the first and second die packages 104(1), 104(2) and their respective first and second dies 102(1), 102(2). This facilitates circuits in the first and second dies 102(1), 102(2) being spilt over the first and second dies 102(1), 102(2), while maintaining signal connection paths that may be needed between the circuits in the first and second dies 102(1), 102(2) for the intended operation. The first and second vertical interconnects 110(1), 110(2) in the respective first and second die packages 104(1), 104(2) being disposed adjacent to the first and second dies 102(1), 102(2) provides through-connections through the first and second die packages 104(1), 104(2). In this manner, as an example, TSVs are not required to be fabricated in the multi-die IC package 100 that extend through the first and second dies 102(1), 102(2) themselves to provide signal routing between the respective first and second die packages 104(1), 104(2). TSVs may be more difficult and costly to fabricate in an IC package. And if the multi-die IC package 100 is designed based on prior two-dimensional (2D) IC package designs and fabrication rules for example, that did not include TSVs for stacked die connections, providing the first and second vertical interconnects 110(1), 110(2) adjacent to the first and second dies 102(1) in the horizontal direction(s) (X- and/or Y-axes direction(s)) in the respective first and second die packages 104(1), 104(2) may be less complex and costly to fabricate.

Figure 2A:
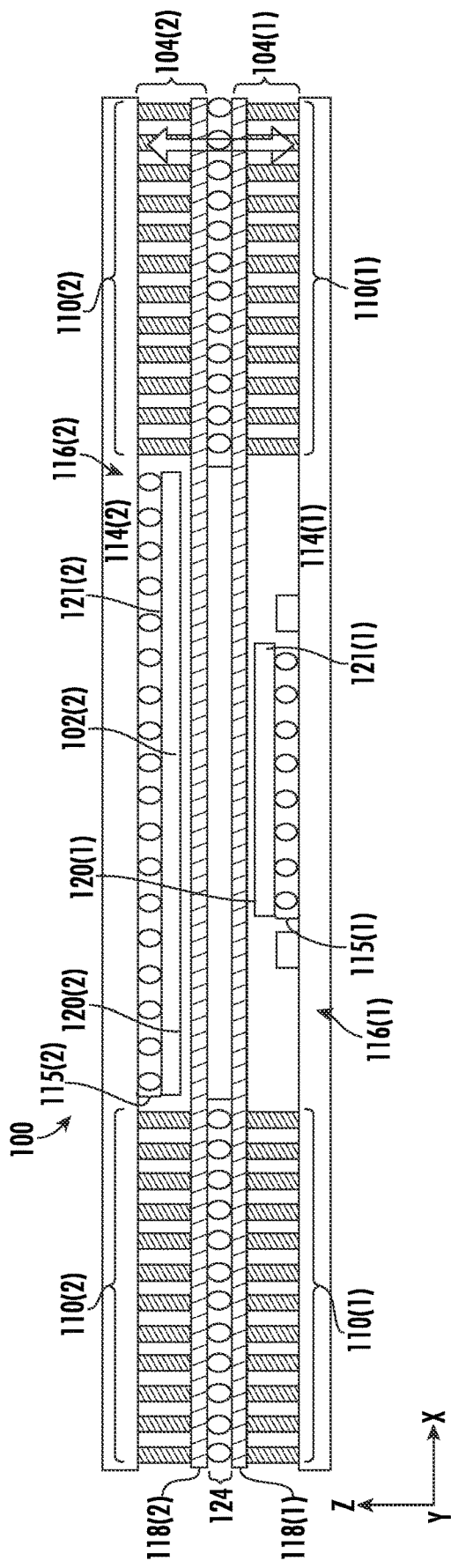
FIG. 2A is a side view of the split die packages stacked on top of each other in a vertical direction in the multi-die IC package of FIG. 1.
Figure 2B:
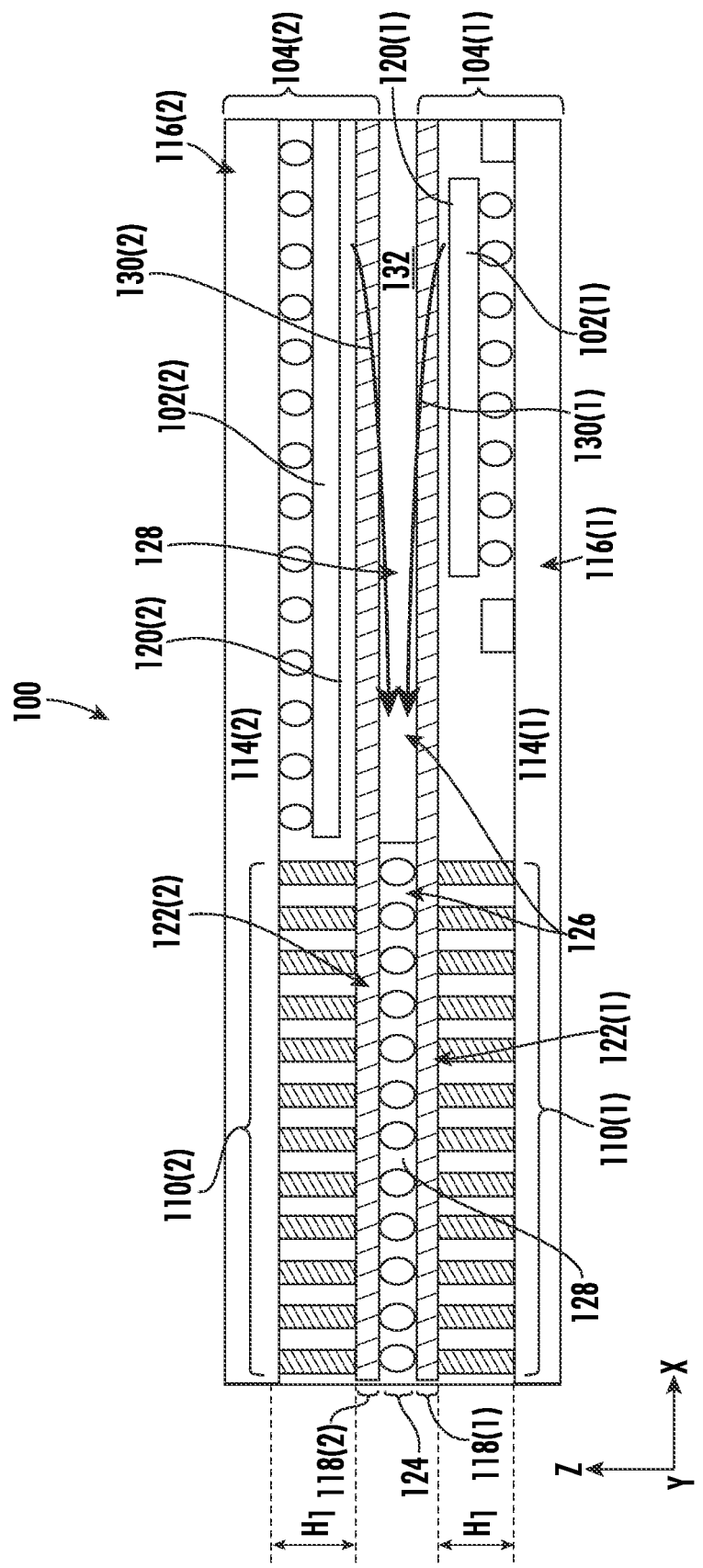
FIG. 2B is a close-up, side view of the split die packages stacked on top of each other in a vertical direction in FIG. 2A.

FIG. 2A is a side view of the first and second die packages 104(1), 104(2) in the multi-die IC package 100 in FIG. 1. FIG. 2B is a close-up, left side view of the first and second die packages 104(1), 104(2) in the multi-die IC package 100. FIGS. 2A and 2B will be referenced to discuss additional exemplary detail of the in the multi-die IC package 100.

In this regard, as shown in FIGS. 2A and 2B, the first and second die packages 104(1), 104(2) in the multi-die IC package 100 also include optional, respective first and second interposer substrates 118(1), 118(2). With reference to the first die package 104(1), the first interposer substrate 118(1) is disposed adjacent to the first die 102(1), such that the first die 102(1) is disposed between the first interposer substrate 118(1) and the first package substrate 114(1) in this example. In this example, the first interposer substrate 118(1) is disposed adjacent to an inactive side 120(1) of the first die 102(1). In this example, as shown in FIG. 2A, the first and second dies 102(1), 102(2) are stacked with respect to each other in a back-to-back configuration where the inactive sides 120(1), 120(2) of the first and second dies 102(1), 102(2) are disposed adjacent to each other. In this example, active sides 121(1), 121(2) of the respective first and second dies 102(1), 102(2) are disposed adjacent to their first and second package substrates 114(1), 114(2). Alternatively, the second die 102(2) could be flipped such that its active side 121(2) is adjacent to the inactive side 120(1) of the first die 102(1). Also, the first die 102(1) could be flipped such that its active side 121(1) is adjacent to the second die 102(2), and for example the second inactive side 120(2) of the second die 102(2). The multi-die IC package 100 is not limited to any particular orientation of the first and second dies 102(1), 102(2) in their respective first and second die packages 104(1), 104(2). The first vertical interconnects 110(1) in the first die package 104(1) are coupled to the first interposer substrate 118(1). As shown in FIG. 2B, the first interposer substrate 118(1) includes one or more metallization layers that include metal interconnects 122(1) that are coupled to the first vertical interconnects 110(1). Metal interconnects 122(1) in the first interposer substrate 118(1) are coupled to metal interconnects 122(2) in a metallization layer(s) in a second interposer substrate 118(2) in the second die package 104(2) adjacent to the first interposer substrate 118(1) to facilitate connections between the first and second die packages 104(1), 104(2).

Also, as shown in FIGS. 2A and 2B, the second die package 104(2) includes the second interposer substrate 118(2) disposed adjacent to the second die 102(2), such that the second die 102(2) is disposed between the second interposer substrate 118(2) and the second package substrate 114(2) in this example. In this example, the second interposer substrate 118(2) is disposed adjacent to an inactive side 120(2) of the second die 102(2). The second vertical interconnects 110(2) in the second die package 104(2) are coupled to the second interposer substrate 118(2). The second interposer substrate 118(2) includes one or more metallization layers that include metal interconnects 122(2) that are coupled to the second vertical interconnects 110(2). Metal interconnects 122(2) in the second interposer substrate 118(2) are coupled to metal interconnects 122(1) in the first interposer substrate 118(1) in the first die package 104(1) adjacent to the second interposer substrate 118(2) to facilitate connections between the first and second die packages 104(1), 104(2).

With continuing reference to FIGS. 2A and 2B, in this example, external interconnect bumps 124 (e.g., solder bumps, BGAs, LGAs) are disposed between the first and second interposer substrates 118(1), 118(2) to provide connections between their respective metal interconnects that are coupled to the respective first and second vertical interconnects 110(1), 110(2) in the first and second die packages 104(1), 104(2). In this manner, the first and second interposer substrates 118(1), 118(2) provide an electrical connection interface to their respective first and second die packages 104(1), 104(2) and the first and second dies 102(1), 102(2) therein, because the first and second interposer substrates 118(1), 118(2) are coupled to the respective first and second vertical interconnects 110(1), 110(2) in the first and second die packages 104(1), 104(2). The first and second vertical interconnects 110(1), 110(2) in the first and second die packages 104(1), 104(2) are coupled to the respective first and second package substrates 114(1), 114(2), and the respective first and second package substrates 114(1), 114(2) are coupled to the first and second dies 102(1), 102(2).

Thus, the first and second interposer substrates 118(1), 118(2) in the respective first and second die packages 104(1), 104(2) of the multi-die IC package 100 are coupled to the first and second vertical interconnects 110(1), 110(2) to provide signal connections and routing to the respective first and second package substrates 114(1), 114(2).

Also, in this exemplary arrangement of coupling the first and second die packages 104(1), 104(2) (and their respective first and second interposer substrates 118(1), 118(2) in this example) through external interconnect bumps 124, this may allow for a smaller pitch of the first and second vertical interconnects 110(1), 110(2) in the first and second die packages 104(1), 104(2). This is because as shown in FIG. 2B, the first and second vertical interconnects 110(1), 110(2) provided in the first and second die packages 104(1), 104(2) are of smaller individual heights $H_1$ rather than a combined height of the first and second die packages 104(1), 104(2). Thus, the first and second vertical interconnects 110(1), 110(2) have smaller aspect ratio than if the vertical interconnects 110(1), 110(2) were combined into a single, taller vertical interconnects in a single die package. In the latter case, the vertical interconnects would potentially extend twice the height $H_1$ and thus have a higher aspect ratio. Note that the respective heights $H_1$ of the first and second vertical interconnects 110(1), 110(2) can be different heights. Thus, providing the first and second dies 102(1), 102(2) in separate stacked and coupled first and second die packages 104(1), 104(2), with their first and second vertical interconnects 110(1), 110(2) coupled through external interconnect bumps 124, can support an increased density of first and second vertical interconnects 110(1), 110(2) to provide a higher connection density in the multi-die IC package 100.

Also, as shown in FIG. 2B, space 126 is created between the stacked first and second die packages 104(1), 104(2) disposed adjacent to each other, as stood off from each other through the external interconnect bumps 124. This additional space 126 forms a cavity 128 that serves to provide additional area for heat dissipation from heat generated by the first and second dies 102(1), 102(2) during their operation, as shown by the thermal dissipation vectors 130(1), 130(2). The cavity 128 provides an opportunity for thermal management for the multi-die IC package 100. As one example, the cavity 128 can be left void with air to provide heat dissipation. Alternatively, or in addition, a thermally conductive material 132, such as a thermally conductive paste or gel for example, can be disposed in the cavity 128 to enhance the dissipation rate of heat generated by the first and second dies 102(1), 102(2). Also, in this example, because the cavity 128 is formed adjacent to both the first and second die packages 104(1), 104(2), the cavity 128 is thermally shared by the first and second die packages 104(1), 104(2) to conserve spaces provided for thermal dissipation. Thus, the cavity 128 can provide heat dissipation for both the first and second dies 102(1), 102(2) in the first and second die packages 104(1), 104(2). For example, both the first and second dies 102(1), 102(2) may generate different amounts of heat at different times, such that the cavity 128 available from a thermal budget standpoint to dissipate more heat from one die 102(1), 102(2) than the other die 102(1), 102(2), and vice versa.

Note that although the multi-die IC package 100 in FIG. 1 includes three (3) dies 102(1)-103(3) stacked on top of each other in the vertical direction (Z-axis direction) in their respective die packages 104(1)-104(3), such is not limiting. The multi-die IC package 100 in FIG. 1 could include the first and second dies 102(1), 102(2) without including the third die package 104(1) with the third die 102(3). Also, the multi-die IC package 100 could be provided with more than the three (3) stacked dies 102(1)-103(3) dies shown in FIG. 1. Providing a multi-die IC package that includes split dies provided in respective, separate die packages, wherein each die package includes vertical interconnects disposed adjacent to its respective die to provide through-connections through the die package, is not limited to any particular number of dies.

Figure 3:
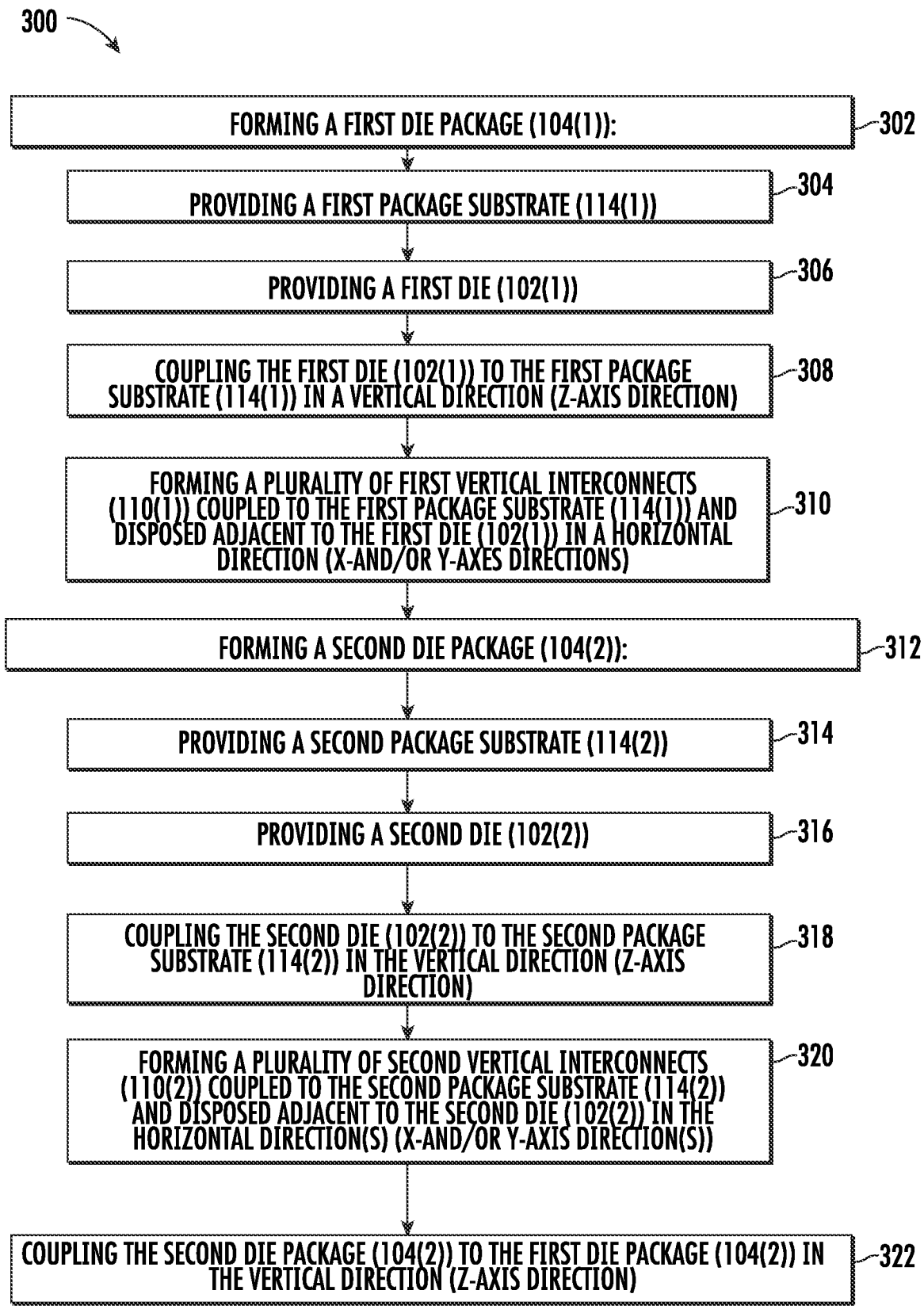
FIG. 3 is a flowchart illustrating an exemplary fabrication process of fabricating the multi-die IC package that includes split dies provided in respective, separate die packages, wherein each die package includes vertical interconnects disposed adjacent to its respective die to provide through-connections through the die package for interconnections for signal routing, including but not limited to the multi-die package in FIG. 1, and its split die packages in FIGS. 1-2B.

FIG. 3 is a flowchart illustrating an exemplary fabrication process 300 of fabricating a multi-die IC package that includes split dies provided in respective, separate die packages, wherein each die package includes vertical interconnects disposed adjacent to its respective die to provide through-connections through the die package. The fabrication process 300 in FIG. 3 can be employed to fabricate the multi-die IC package in FIGS. 1-2B. In this regard, the fabrication process 300 in FIG. 3 will be discussed in conjunction with the multi-die IC package 100 in FIGS. 1-2B.

In this regard, as shown in FIG. 3, a first step of the fabrication process 300 can be forming a first die package 104(1) (block 302 in FIG. 3). The process of forming the first die package 104(1) can include providing a first package substrate 114(1) (block 304 in FIG. 3). The process of forming the first die package 104(1) can also include providing a first die 102(1) (block 306 in FIG. 3). The process of forming the first die package 104(1) can include coupling the first die 102(1) to the first package substrate 114(1) in a vertical direction (Z-axis direction) (block 308 in FIG. 3). The process of forming the first die package 104(1) can include forming a plurality of first vertical interconnects 110(1) coupled to the first package substrate 114(1) and disposed adjacent to the first die 102(1) in a horizontal direction(s) (X- and/or Y-axes direction(s)) (block 310 in FIG. 3). Another step of the fabrication process 300 can be forming a second die package 104(2) (block 312 in FIG. 3). The process of forming the second die package 104(2) can include providing a second package substrate 114(2) (block 314 in FIG. 3). The process of forming the second die package 104(2) can also include providing a second die 102(2) (block 316 in FIG. 3). The process of forming the second die package 104(2) can include coupling the second die (102(2)) to the second package substrate (114(2)) in the vertical direction (Z-axis direction) (block 318 in FIG. 3). The process of forming the second die package 104(2) can include forming a plurality of second vertical interconnects 110(2) coupled to the second package substrate (114(2)) and disposed adjacent to the second die 102(2) in the horizontal direction(s) (X- and/or Y-axes direction(s)) (block 320 in FIG. 3). Another step of the fabrication process 300 can be coupling the second die package 104(2) to the first die package 104(1) in the vertical direction (Z-axis direction) to form the multi-die IC package 100 (block 322 in FIG. 3).

There are other fabrication processes that can be employed to fabricate the multi-die IC package 100 in FIGS. 1-2B. This includes the fabrication of the first, second, and third die packages 104(1)-104(3) as separate packages, which can then be assembled together in a stacked configuration.

For example, FIGS. 4A and 4B is a flowchart illustrating an exemplary fabrication process 400 for fabricating the exemplary upper, third die package 104(3) in the multi-die IC package 100 in FIG. 1. FIGS. 5A-5D are exemplary fabrication stages 500A-500D during fabrication of the third die package 104(3) in the multi-die IC package 100 in FIG. 1, and according to the fabrication process 400 in FIGS. 4A and 4B. The fabrication process 400 in FIGS. 4A and 4B will be discussed in conjunction with the exemplary fabrication stages 500A-500D in FIGS. 5A-5D and the third die package 104(3) in the multi-die IC package 100 in FIG. 1.

In this regard, as shown in the exemplary fabrication stage 500A in FIG. 5A, a first step in the fabrication process 400 to fabricate the third die package 104(3) can be to form the third package substrate 114(3) (block 402 in FIG. 4A). The third package substrate 114(3) could be comprised of laminated substrate layers with any number of metallization layers 502(1)-502(X) each with metal interconnects 116(3) (e.g., metal traces, metal lines) disposed therein as an example. The third package substrate 114(3) could be comprised of RDLs with redistributed metal lines or traces formed in metallization layers therein to form metal interconnects 116(3), as another example. The third package substrate 114(3) could include and embedded trace substrate (ETS) layer(s) with metal interconnects 116(3) (traces) embedded in a metal layer(s), as yet another example.

As shown in the exemplary fabrication stage 500B in FIG. 5B, a next step in the fabrication process 400 to fabricate the third die package 104(3) can be to place electronic/electrical components 504 (that includes the third dies 102(3)) in contact with a top surface 506 of the third die package 104(2) on the third package substrate 114(3) (block 404 in FIG. 4A). The third dies 102(3) can be electrically coupled to the third package substrate 114(3) and metal interconnects 116(3) disposed in the metallization layers 502(1)-502(X) therein. As shown in the exemplary fabrication stage 500C in FIG. 5C, a next step in the fabrication process 400 to fabricate the third die package 104(3) can be to form a package mold 508 over the electronic/electrical components 504, including the third dies 102(3), with a molding compound material 510 to protect the electronic/electrical components 504 (block 406 in FIG. 4A). As shown in the exemplary fabrication stage 500I) in FIG. 5I), a next step in the fabrication process 400 to fabricate the third die package 104(3) can be to form the external interconnect bumps 105 in contact with the third package substrate 114(3), and more particularly in contact with metal interconnect 116(3) exposed from the bottom surface 512 of the third package substrate 114(3), to provide an electrical interface to the third die package 104(3) (block 408 in FIG. 4B).

FIGS. 6A and 6B is a flowchart illustrating an exemplary fabrication process 600 for fabricating a die package that can be either or both of first and second die packages 104(1), 104(2) in the multi-die IC package 100 in FIG. 1. FIGS. 7A-7F are exemplary fabrication stages 700A-700F during fabrication of the first and or second die package 104(1), 104(2) in the multi-die IC package 100 in FIG. 1, and according to the fabrication process 600 in FIGS. 6A and 6B.

As discussed below, in the fabrication process 600, the die package is fabricated by first building up the package substrate and forming the vertical interconnects on sides of a cavity that is provided for later placement of a die. The fabrication process 600 in FIGS. 6A and 6B also involves fabricating an interposer substrate in a die package. The fabrication process 600 in FIGS. 6A and 6B will be discussed in conjunction with the exemplary fabrication stages 700A-700F in FIGS. 7A-7F and the first die package 104(1) in the multi-die IC package 100 in FIG. 1. However, note that the fabrication process 600 in FIGS. 6A and 6B can also be employed to fabricate the second die package 104(2) in the multi-die IC package 100 in FIG. 1.

In this regard, as shown in the exemplary fabrication stage 700A in FIG. 7A, a first step in the fabrication process 600 to fabricate the first die package 104(1) can be to form the first package substrate 114(1) (block 602 in FIG. 6A). The first package substrate 114(1) could be comprised of laminated substrate layers with any number of metallization layers 702(1)-702(X) each with metal interconnects 116(1) (e.g., metal traces, metal lines) disposed therein, as an example. The first package substrate 114(1) could be comprised of RDLs with redistributed metal lines or traces formed in metallization layers therein to form metal interconnects 116(1) as another example. The first package substrate 114(1) could include and embedded trace substrate (ETS) layers) with metal interconnects 116(1) (traces) embedded in a metal layer(s) as yet another example. As shown in the exemplary fabrication stage 700B in FIG. 7B, a next step in the fabrication process 600 to fabricate the first die package 104(1) can be to form the first vertical interconnects 110(1) coupled to the first package substrate 114(1). To form the first vertical interconnects 110(1), a dielectric layer 704 is first disposed on the first package substrate 114(1). The dielectric layer 704 is then patterned and openings formed where it is desired to form the first vertical interconnects 110(1) (block 604 in FIG. 6A). For example, the dielectric layer 704 can be patterned and opened using a lithography process with a photoresist layer (not shown) disposed on the dielectric layer 704 and patterned. A metal material is disposed in the openings formed in the dielectric layer 704 to form the vertical interconnects 110(1).

As shown in the exemplary fabrication stage 700C in FIG. 7C, a next step in the fabrication process 600 to fabricate the first die package 104(1) can be to form an opening 706 in the dielectric layer 704 between the vertical interconnects 110(1) to provide a cavity 708 for disposing the first die 102(1) coupled to the first package substrate 114(1) (block 606 in FIG. 6A). As shown in the exemplary fabrication stage 700D in FIG. 7D, a next step in the fabrication process 600 to fabricate the first die package 104(1) can be placement of the first die 102(1) in the cavity 708 on the first package substrate 114(1) and electrically coupled to the first package substrate 114(1) (block 608 in FIG. 6B). As shown in the exemplary fabrication stage 700E in FIG. 7E, a next step in the fabrication process 600 to fabricate the first die package 104(1) can be disposing the molding compound material 510 over the first die 102(1) and the first vertical interconnects 110(1) to form the package mold 508 (block 610 in FIG. 6B). As also shown in the exemplary fabrication stage 700E in FIG. 7E, a next step in the fabrication process 600 to fabricate the first die package 104(1) can be to form the interposer substrate 118(1) in contact with the first vertical interconnects 110(1) (block 610 in FIG. 6B). The first vertical interconnects 110(1) are placed in electrical contact with metal interconnects 122(1) in the first interposer substrate 118(1). As also shown in the exemplary fabrication stage 700F in FIG. 7F, a next step in the fabrication process 600 to fabricate the first die package 104(1) can be to form the external interconnect bumps 124 on an outer surface 710 of the first interposer substrate 118(1) and coupled to metal interconnects 122(1) in the first interposer substrate 118(1) (block 612 in FIG. 6B). This is to prepare the first die package 104(1) for the stacking of the second die package 104(2) thereon in electrical contact with the external interconnect bumps 124 and first interposer substrate 118(1).

FIGS. 8A and 8B is a flowchart illustrating another exemplary fabrication process 800 for fabricating a die package that can be either or both of first and second die packages 104(1), 104(2) in the multi-die IC package 100 in FIG. 1. FIGS. 9A-9F are exemplary fabrication stages 900A-900F during fabrication of the first and/or second die package 104(1), 104(2) in the multi-die IC package 100 in FIG. 1, and according to the fabrication process 800 in FIGS. 8A and 8B. As discussed below, in the fabrication process 800, the die package is fabricated by first disposing a die on the package substrate and then forming a package mold on the die and package substrate. Thereafter, the package mold is patterned and opened to form openings where the vertical interconnects are to be formed. The vertical interconnects are formed in contact with the package substrate. The fabrication process 800 in FIGS. 8A and 8B does not include an interposer substrate like the fabrication process 600 in FIGS. 6A and 6B. The fabrication process 800 in FIGS. 8A and 8B will be discussed in conjunction with the exemplary fabrication stages 900A-900F in FIGS. 9A-9F and first die package 104(1) in the multi-die IC package 100 in FIG. 1. However, note that the fabrication process 800 in FIGS. 8A and 8B can also be employed to fabricate the second die package 104(2) in the multi-die IC package 100 in FIG. 1.

In this regard, as shown in the exemplary fabrication stage 900A in FIG. 9A, a first step in the fabrication process 800 to fabricate the first die package 104(1) can be to form the first package substrate 114(1) (block 802 in FIG. 8A). The first package substrate 114(1) could be comprised of laminated substrate layers with any number of metallization layers 902(1)-902(X) each with metal interconnects 116(1) (e.g., metal traces, metal lines) disposed therein as an example. The first package substrate 114(1) could be comprised of RDLs with redistributed metal lines or traces formed in metallization layers therein to form metal interconnects 116(1) as another example. The first package substrate 114(1) could include an embedded trace substrate (ETS) layer(s) with metal interconnects 116(1) (traces) embedded in a metal layer(s) as yet another example. As shown in the exemplary fabrication stage 900B in FIG. 9B, a next step in the fabrication process 800 to fabricate the first die package 104(1) can be placement of the first die 102(1) on the first package substrate 114(1) and electrically coupling the first die 102(1) to the first package substrate 114(1) (block 804 in FIG. 8A). As shown in the exemplary fabrication stage 900C in FIG. 9C, a next step in the fabrication process 800 to fabricate the first die package 104(1) can be disposing a molding compound material 910 over the first die 102(1) to form the package mold 908 (block 806 in FIG. 8A).

As shown in the exemplary fabrication stage 900D in FIG. 9D, a next step in the fabrication process 800 to fabricate the first die package 104(1) can be to form the first vertical interconnects 110(1) coupled to the first package substrate 114(1) (block 808 in FIG. 8B). To form the first vertical interconnects 110(1), the package mold 908 is patterned and openings formed where it is desired to form the first vertical interconnects 110(1). For example, the package mold 908 can be patterned and opened using a lithography process with a photoresist layer (not shown) disposed on the package mold 908 and patterned. A metal material is disposed in the openings formed in the package mold 908 to form the vertical interconnects 110(1) (block 808 in FIG. 8B). As shown in the exemplary fabrication stage 900E in FIG. 9E, a next step in the fabrication process 800 can be to place and couple any backside components 912 on a bottom surface 914 of the first package substrate 114(1) (block 810 in FIG. 8B). As shown in the exemplary fabrication stage 900F in FIG. 9F, a next step in the fabrication process 800 to fabricate the first die package 104(1) can be to form the external interconnect bumps 108 on the bottom surface 914 of the first package substrate 114(1) and coupled to metal interconnects 116(1) in the first package substrate 114(1) (block 812 in FIG. 8B). This is to prepare the first die package 104(1) to be placed on and coupled to the PCB 106, as shown in FIG. 1.

Note that if the fabrication process in FIGS. 8A and 8B were employed to fabricate the second die package 104(2), in block 812 and in fabrication stage 900F in FIG. 9F, external interconnect bumps 105 would be formed on the bottom surface 914 of the second package substrate 114(2) and coupled to metal interconnects 116(2) in the second package substrate 114(2).

FIGS. 10A and 10B is a flowchart illustrating another exemplary fabrication process 1000 for fabricating a die package that can be either or both of first and second die packages 104(1), 104(2) in the multi-die IC package 100 in FIG. 1. FIGS. 11A-11G are exemplary fabrication stages 1100A-1100G during fabrication of the first and/or second die package 104(1), 104(2) in the multi-die IC package 100 in FIG. 1, and according to the fabrication process 1000 in FIGS. 10A and 10B. As discussed below, in the fabrication process 1000, the die package includes RDLs as metallization layers as a package substrate and interposer substrate. The die package is fabricated by first forming the first vertical interconnects on a back side RDL disposed on a carrier to form an interposer substrate. The inactive side of the die and mold material is subsequently disposed on the back side RDL. Thereafter, a front side RDL is formed to form a package substrate. The vertical interconnects in the die package extend in contact with metal interconnects in the form of RDL interconnects in this example between the back side and front side RDLs to provide through connections in the die package, as respective interposer substrate and package substrate. The fabrication process 1000 in FIGS. 10A and 10B will be discussed in conjunction with the exemplary fabrication stages 1100A-1100G in FIGS. 11A-11G and first die package 104(1) in the multi-die IC package 100 in FIG. 1. However, note that the fabrication process 1000 in FIGS. 10A and 10B can also be employed to fabricate the second die package 104(2) in the multi-die IC package 100 in FIG. 1.

In this regard, as shown in the exemplary fabrication stage 1100A in FIG. 11A, a first step in the fabrication process 1000 to fabricate the first die package 104(1) can be to provide a carrier 1102 and to form a back side RDL 1104 as a form of the interposer substrate 118(1) (block 1002 in FIG. 10A). The back side RDL 1104 has metal interconnects 122(1) formed thereby from the redistribution of metal layers in the back side RDL 1104. As shown in the exemplary fabrication stage 1100B in FIG. 11B, a next step in the fabrication process 1000 to fabricate the first die package 104(1) is to form and dispose the first vertical interconnects 110(1) on the back side RDL 1104 in contact with respective metal interconnects 122(1) (block 1004 in FIG. 10A). As shown in the exemplary fabrication stage 1100C in FIG. 11C, a next step in the fabrication process 1000 can be to place and couple the first die 102(1) on the back side RDL 1104. Wherein the inactive side 120(1) of the first die 102(1) is disposed on the back side RDL 1104 (block 1006 in FIG. 10A). As shown in the exemplary fabrication stage 1100D in FIG. 11D, a next step in the fabrication process 1000 can be to dispose a molding compound material 1106 over the first die 102(1) and the first vertical interconnects 110(1) to form the package mold 1108 (block 1008 in FIG. 10A).

As shown in the exemplary fabrication stage 1100E in FIG. 11E, a next step in the fabrication process 1000 can be to form a front side RDL 1110 metallization layer(s) as a first package substrate 114(1) on a top surface 1112 of the package mold 1108 (block 1010 in FIG. 10B). This forms the first die package 104(1) attached to the carrier 1102, Metal interconnects 116(1) in the front side RDL 1110 are coupled to the first vertical interconnects 110(1) so that there is a connection path from the back side RDL 1104 to the front side RDL 1110 of the first die package 104(1). As shown in the exemplary fabrication stage 1100F in FIG. 11F, a next step in the fabrication process 1000 can be to remove the carrier 1102 from the first die package 104(1) (block 1012 in FIG. 10B). As shown in the exemplary fabrication stage 1100E in FIG. 11G, a next step in the fabrication process 1000 to fabricate the first die package 104(1) can be to flip the die package 104(1) and form external interconnect bumps 108 on the front side RDL 1110 and coupled to metal interconnects 116(1) in the front side RDL 1110 (block 1014 in FIG. 10B). This is to prepare the first die package 104(1) to be placed on and coupled to the PCB 106, as shown in FIG. 1.

Note that if the fabrication process in FIGS. 10A and 10B were employed to fabricate the second die package 104(2), in block 1014 and in fabrication stage 1100G in FIG. 11F, external interconnect bumps 105 would be formed on the front side RDL 1110 as a second package substrate 114(2) and coupled to metal interconnects 116(2) in the front side RDL 1110.

FIGS. 12A and 12B is a flowchart illustrating another exemplary fabrication process 1200 for fabricating a die package that can be either or both of first and second die packages 104(1), 104(2) in the multi-die IC package 100 in FIG. 1. FIGS. 13A-13G are exemplary fabrication stages 1300A-1300G during fabrication of the first and/or second die package 104(1), 104(2) in the multi-die IC package 100 in FIG. 1, and according to the fabrication process 1200 in FIGS. 12A and 12B. As discussed below, in the fabrication process 1200, the die package includes RDLs as metallization layers as a package substrate and interposer substrate. The die package is fabricated by first forming the first vertical interconnects on a front side RDL as an interposer substrate. The active side of the die and mold material is subsequently disposed front side RDL. Thereafter, a back side RDL is formed on the carrier to form a package substrate. The vertical interconnects in the die package extend in contact with metal interconnects in the form of RDL interconnects in this example between the front side and back side RDLs to provide through connections in the die package. The fabrication process 1200 in FIGS. 12A and 12B will be discussed in conjunction with the exemplary fabrication stages 1300A-1300G in FIGS. 13A-13G and first die package 104(1) in the multi-die IC package 100 in FIG. 1. However, note that the fabrication process 1200 in FIGS.

12A and 12B can also be employed to fabricate the second die package 104(2) in the multi-die IC package 100 in FIG. 1.

In this regard, as shown in the exemplary fabrication stage 1300A in FIG. 13A, a first step in the fabrication process 1200 to fabricate the first die package 104(1) can be to provide a carrier 1302 and to form a front side RDL 1310 as a form of a package substrate 114(1) (block 1202 in FIG. 12A). The front side RDL 1310 has metal interconnects 116(1) formed thereby from the redistribution of metal layers in the front side RDL 1310. As shown in the exemplary fabrication stage 1300B in FIG. 13B, a next step in the fabrication process 1200 to fabricate the first die package 104(1) is to form and dispose the first vertical interconnects 110(1) on the front side RDL 1310 in contact with respective metal interconnects 116(1) (block 1204 in FIG. 12A). As shown in the exemplary fabrication stage 1300C in FIG. 13C, a next step in the fabrication process 1200 can be to place and couple the first die 102(1) on the front side RDL 1310, wherein the active side 121(1) of the first die 102(1) is disposed on the front side RDL, 1310 (block 1206 in FIG. 12A). As shown in the exemplary fabrication stage 1300D in FIG. 13D, a next step in the fabrication process 1200 can be to dispose a molding compound material 1306 over the first die 102(1) and the first vertical interconnects 110(1) to form the package mold 1308 (block 1208 in FIG. 12A).

As shown in the exemplary fabrication stage 1300E in FIG. 13E, a next step in the fabrication process 1200 can be to form a back side RDL 1304 metallization layer(s) as an interposer substrate on a top surface 1312 of the package mold 1308 (block 1210 in FIG. 12B). This forms the first die package 104(1) attached to the carrier 1302. Metal interconnects 122(1) in the back side RDL 1304 are coupled to the first vertical interconnects 110(1) so that there is a connection path from the front side RDL 1310 to the back side RDL 1304 of the first die package 104(1). As shown in the exemplary fabrication stage 1300F in FIG. 13F, a next step in the fabrication process 1200 can be to remove the carrier 1302 from the first die package 104(1) (block 1212 in FIG. 12B). As shown in the exemplary fabrication stage 1300G in FIG. 13G, a next step in the fabrication process 1200 to fabricate the first die package 104(1) can be to form external interconnect bumps 108 on the front side RDL 1310 and coupled to metal interconnects 116(1) in the front side RDL 1310 (block 1214 in FIG. 12B). This is to prepare the first die package 104(1) to be placed on and coupled to the PCB 106, as shown in FIG. 1.

Note that the first die package 104(1) does not have to be flipped like in the fabrication process 1000 in step 1014 since the front side RDL 1310 is formed first in the fabrication process 1200 in FIGS. 12A and 12B.

Note that if the fabrication process in FIGS. 12A and 12B were employed to fabricate the second die package 104(2), in block 1214 and in fabrication stage 1300G in FIG. 13G, external interconnect bumps 105 would be formed on the front side RDL 1310 as a second package substrate 114(2) and coupled to metal interconnects 116(2) front side RDL 1310.

As discussed above, the die packages 104(1)-104(3) in the multi-die IC package 100 in FIG. 1 can be fabricated and tested separately, and then assembled into the multi-die IC package 100 as a final step. This is shown in the exemplary assembly stages 1400A-1400D2 in FIGS. 14A-14D-2. Assembly stage 1400A in FIG. 14A is to provide a fabricated third die package 104(3). Assembly stage 1400B in FIG. 14B is to provide a fabricated second die package 104(2) to which the third die package 104(3) can be coupled. Assembly stage 1400C-1 in FIG. 14C-1 is to provide a fabricated first die package 104(1)(1) that does not include a first interposer substrate 118(1) as an option, as discussed above. The first, second, and third die packages 104(1)(1), 104(2), 104(3) in assembly stages 1400C-1, 1400B, and 1400A can be coupled to each other in a vertical direction (Z-axis direction) to form the multi-die IC package 100(1) shown in FIG. 14I)-1 that includes the first die package 104(1)(1) that does not include the first interposer substrate 118(1). The thermally conductive material 132 can be disposed in the cavity 128 that is formed by disposing the second die package 104(2) on the first die package 104(1)(1).

Alternatively, assembly stage 1400C-2 in FIG. 14C-2 is to provide a fabricated first die package 104(1)(2) that includes the first interposer substrate 118(1) as an option as discussed above. The first, second, and third die packages 104(1)(2), 104(2), 104(3) in assembly stages 1400C-2, 1400B, and 1400A can be coupled to each other in a vertical direction (Z-axis direction) to form the multi-die IC package 100(2) shown in FIG. 14D-2 that includes the first die package 104(1)(2) that has the first interposer substrate 118(1). The thermally conductive material 132 can be disposed in the cavity 128 that is formed by disposing the second die package 104(2) on the first die package 104(1)(1).

Note that other processes can be used to fabricate the first, second, and/or third die packages 104(1)-104(3) in the multi-die IC package 100, or any other multi-die IC package include split dies provided in respective, separate die packages, wherein each die package includes vertical interconnect disposed adjacent to its respective die to provide through-connections through the die package for interconnections for signal routing. As another example, the first, second, and/or third die packages 104(1)-104(3) could be fabricated as a molded electronic package (MEP) using a MEP fabrication process as is known. As another example, the first, second, and/or third die packages 104(1)-104(3) could be fabricated as a wafer-level package (WLP) using WLP fabrication process as is known. RDLs can be fabricated to be included and/or provide a package substate and/or an interposer substate as discussed above. The first, second, and/or third die packages 104(1)-104(3) can also be coupled to each other using a package-on-package (POP) process to form the multi-die IC package 100 as a POP.

Multi-die IC packages that include split dies provided in respective, separate die packages, Wherein each die package includes vertical interconnect disposed adjacent to its respective die to provide through-connections through the die package for interconnections for signal routing (e.g., I/O and/or power signal routing), including, but not limited to, the IC packages in FIGS. 1-2B, and according to any of the exemplary fabrication processes and fabrication stages in FIGS. 3-14D-2, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 15:
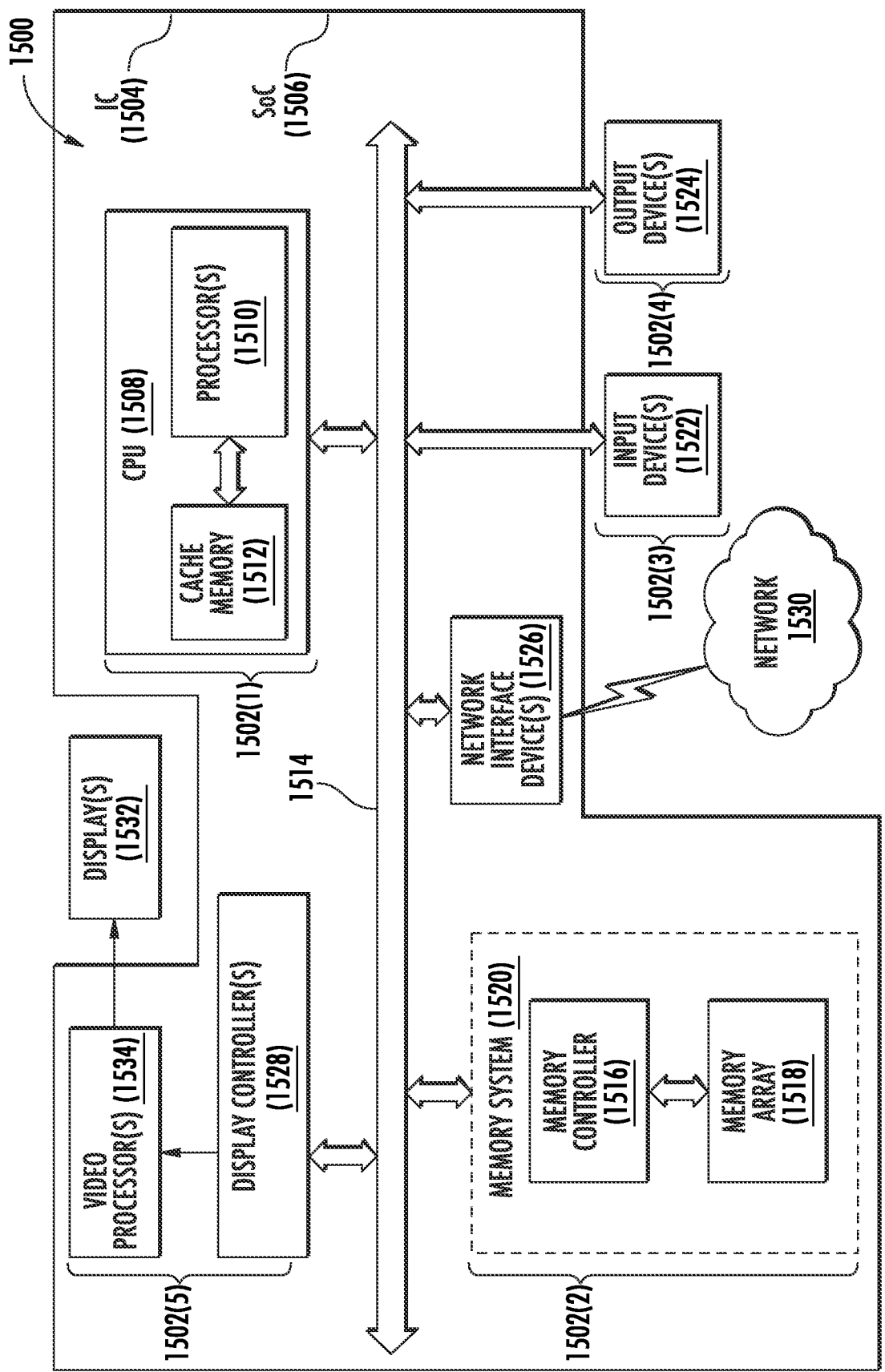
FIG. 15 is a block diagram of an exemplary processor-based system that can include components that can include a multi-die IC package that includes split dies provided in respective, separate die packages, wherein each die package includes vertical interconnects disposed adjacent to its respective die to provide through-connections through the die package for interconnections for signal routing, including, but not limited to, the IC packages FIGS. 1-2B, and according to any of the exemplary fabrication processes and fabrication stages in FIGS. 3-14D-2.

In this regard, FIG. 15 illustrates an example of a processor-based system 1500 including a circuit that can be provided in an IC that includes a multi-die IC package 1502 including split dies provided in respective, separate die packages, wherein each die package includes vertical interconnects disposed adjacent to its respective die to provide through-connections through the die package for interconnections for signal routing (e.g. I/O and/or power signal routing), including, but not limited to, the IC packages FIGS. 1-2B, and according to any of the exemplary fabrication processes and fabrication stages in FIGS. 3-14D-2, and according to any aspects disclosed herein. In this example, the processor-based system 1500 may be formed as an IC 1504 in a multi-die IC package 1502 and as a system-on-a-chip (SoC) 1506. The processor-based system 1500 includes a central processing unit (CPU) 1508 that includes one or more processors 1510, which may also be referred to as CPU cores or processor cores. The CPU 1508 may have cache memory 1512 coupled to the CPU 1508 for rapid access to temporarily stored data. The CPU 1.508 is coupled to a system bus 1514 and can intercouple master and slave devices included in the processor-based system 1500. As is well known, the CPU 1508 communicates with these other devices by exchanging address, control, and data information over the system bus 1514. For example, the CPU 1508 can communicate bus transaction requests to a memory controller 1516, as an example of a slave device. Although not illustrated in FIG. 15, multiple system buses 1514 could be provided, wherein each system bus 1514 constitutes a different fabric.

Other master and slave devices can be connected to the system bus 1514. As illustrated in FIG. 15, these devices can include a memory system 1520 that includes the memory controller 1516 and a memory array(s) 1518, one or more input devices 1522, one or more output devices 1524, one or more network interface devices 1526, and one or more display controllers 1528, as examples. Each of the memory systems 1520, the one or more input devices 1522, the one or more output devices 1524, the one or more network interface devices 1526, and the one or more display controllers 1528 can be provided in the same or different multi-die IC packages 1502(1)-1502(5). The input device(s) 1522 can include any type of input device, including, but not limited to, input keys, switches, voice processors, etc. The output device(s) 1524 can include any type of output device, including, but not limited to, audio, video, other visual indicators, etc. The network interface device(s) 1526 can be any device configured to allow exchange of data to and from a network 1530. A network 1530 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1526 can be configured to support any type of communications protocol desired.

The CPU 1508 may also be configured to access the display controller(s) 1528 over the system bus 1514 to control information sent to one or more displays 1532. The display controller(s) 1528 sends information to the display(s) 1532 to be displayed via one or more video processors 1534, which process the information to be displayed into a format suitable for the display(s) 1532. The display controller(s) 1528 and video processor(s) 1534 can be included as ICs in the same or different multi-die IC packages 1502, and in the same or different multi-die IC package 1502 containing the CPU 1508, as an example. The display(s) 1532 can include any type of display, including, but not limited to, a cathode ray tube (CRT), a liquid crystal display (LCD), a plasma display, a light emitting diode (LED) display, etc.

Figure 16:
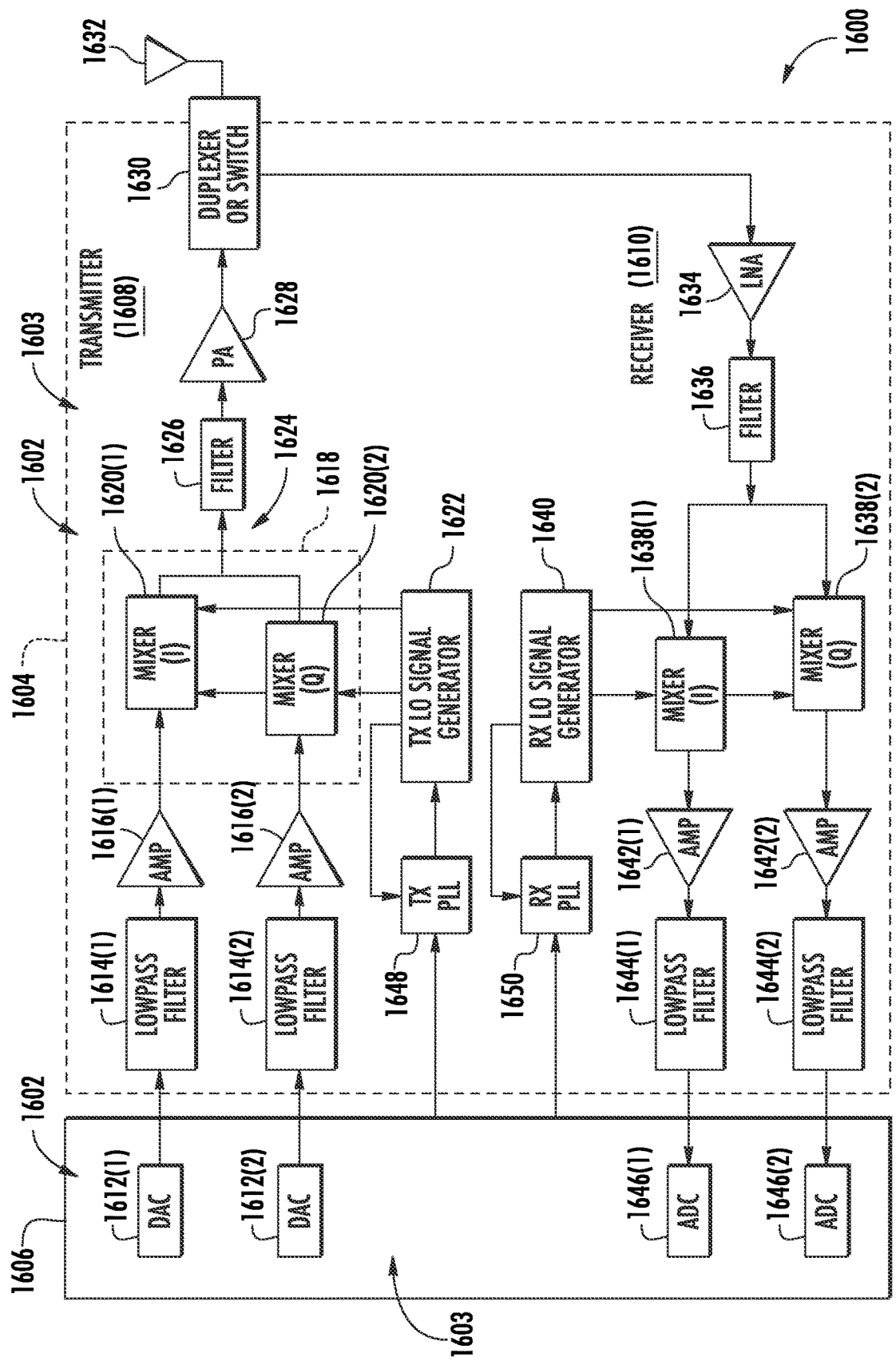
FIG. 16 is a block diagram of an exemplary wireless communications device that includes radio-frequency (RF) components that can include a multi-die IC package that include split dies provided in respective, separate die packages, wherein each die package includes vertical interconnect disposed adjacent to its respective die to provide through-connections through the die package for interconnections for signal routing, including, but not limited to, the IC packages FIGS. 1-2B, and according to any of the exemplary fabrication processes and fabrication stages in FIGS. 3-14D-2.

FIG. 16 illustrates an exemplary wireless communication device 1600 that includes radio frequency (RE) components formed from one or more ICs 1602, wherein any of the ICs 1602 can be included in a multi-die IC package 1603 that includes split dies provided in respective, separate die packages, wherein each die package includes a vertical interconnect disposed adjacent to its respective die to provide through-connections through the die package for interconnections for signal routing, including, but not limited to, the IC packages FIGS. 1-2B, and according to any of the exemplary fabrication processes and fabrication stages in FIGS. 3-14D-2, and according to any aspects disclosed herein. The wireless communications device 1600 may include or be provided in any of the above-referenced devices, as examples. As shown in FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RF ICs (RFICs), mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1610. In the direct-conversion architecture, a signal is frequency-converted between RF and baseband in one stage. The super-heterodyne and direct-conversion architectures may use different circuit blocks and/or have different requirements. In the wireless communications device 1600 in FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes digital-to-analog converters (DACs) 1612(1), 1612 (2) for converting digital signals generated by the data processor 1606 into the I and Q analog output signals, e.g., I and Q output currents, for further processing.

Within the transmitter 1608, lowpass filters 1614(1), 1614(2) filter the I and Q analog output signals, respectively, to remove undesired signals caused by the prior digital-to-analog conversion. Amplifiers (AMPS) 1616(1), 1616(2) amplify the signals from the lowpass filters 1614(1), 1614 (2), respectively, and provide I ad Q baseband signals. An upconverter 1618 upconverts the I and Q baseband signals with I and Q transmit (TX) local oscillator (LO) signals through mixers 1620(1), 1620(2) from a TX LO signal generator 1622 to provide an upconverted signal 1624. A filter 1626 filters the upconverted signal 1624 to remove undesired signals caused by the frequency up-conversion as well as noise in a receive frequency band. A power amplifier (PA) 1628 amplifies the upconverted signal 1624 from the filter 1626 to obtain the desired output power level and provides a transmit RF signal. The transmit RF signal is routed through a duplexer or switch 1630 and transmitted via an antenna 1632.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Down-conversion mixers 1638(1), 1638(2) mix the output of the filter 1636 with I and Q RX LO signals (i.e., LO_1 and LO_Q) from an RX LO signal generator 1640 to generate I and Q baseband signals. The I and Q baseband signals are amplified by AMPs 1642(1), 1642(2) and further filtered by lowpass filters 1644(1), 1644(2) to obtain I and Q analog input signals, which are provided to the data processor 1606. In this example, the data processor 1606 includes analog-to-digital converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency up-conversion, while the RX LO signal generator 1640 generates the I ad Q RX LO signals used for frequency down-conversion. Each LO signal is a periodic signal with a particular fundamental frequency. A TX phase-locked loop (PLL) circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A multiple (multi-) die integrated circuit (IC) package, comprising:
    a first die package, comprising:
        a first package substrate;
        a first die coupled to the first package substrate; and
        a plurality of first vertical interconnects disposed adjacent to the first die in a horizontal direction, each of the plurality of first vertical interconnects coupled to the first package substrate; and
    a second die package adjacent to the first die package in the vertical direction, the second die package comprising:
        a second package substrate;
        a second die adjacent coupled to the second package substrate; and a plurality of second vertical interconnects disposed adjacent to the second die in the horizontal direction, each of the plurality of second vertical interconnects coupled to the second package substrate.

2. The multi-die IC package of clause 1, further not comprising a through-silicon vertical interconnect access (via) (TSV) disposed through the first die and disposed through the second die.

3. The multi-die IC package of any of clauses 1-2, wherein:
   the first die is adjacent to the first package substrate in the vertical direction; and
   the second die is adjacent to the second package substrate in the vertical direction.

4. The multi-die IC package of any of clauses 1-3, wherein:
   the first package substrate comprises a first substrate metallization layer comprising one or more first substrate metal interconnects each coupled to a first vertical interconnect among the plurality of first vertical interconnects;
   the first die comprises one or more first die interconnects each coupled to a first substrate metal interconnect among the one or more first substrate metal interconnects, to couple the one or more first die interconnects to one or more first vertical interconnects among the plurality of first vertical interconnects;
   the second package substrate comprises a second substrate metallization layer comprising one or more second substrate metal interconnects each coupled to a second vertical interconnect among the plurality of second vertical interconnects; and
   the second die comprises one or more second die interconnects each coupled to a second substrate metal interconnect among the one or more second substrate metal interconnects, to couple one or more second die interconnects to the one or more second vertical interconnects among the plurality of second vertical interconnects.

5. The multi-die IC package of clause 4, wherein:
   the first substrate metallization layer comprises a first substrate redistribution layer (RDL) comprising the one or more first substrate metal interconnects comprising one or more first RDL interconnects; and
   the second substrate metallization layer comprises a second substrate RDL comprising the one or more second substrate metal interconnects comprising one or more second RDL interconnects.

6. The multi-die IC package of any of clauses 1-5, wherein:
   the first die package further comprises a first interposer substrate disposed adjacent to the first die, the first die disposed between the first interposer substrate and the first package substrate in the vertical direction; and
   each of the plurality of first vertical interconnects is coupled to the first interposer substrate.

7. The multi-die IC package of clause 6, wherein the first die is additionally coupled to the first interposer substrate.

8. The multi-die IC package of any of clauses 6-7, wherein:
   the second die package further comprises a second interposer substrate disposed adjacent to the second die, the second die disposed between the second interposer substrate and the second package substrate in the vertical direction; and
   each of the plurality of second vertical interconnects is coupled to the second interposer substrate.

9. The multi-die IC package of clause 8, wherein the second die is additionally coupled to the second interposer substrate.

10. The multi-die IC package of any of clauses 6-9, wherein:
    the first package substrate comprises a first substrate metallization layer comprising one or more first substrate metal interconnects each coupled to a first vertical interconnect among the plurality of first vertical interconnects; and
    the first interposer substrate comprises a first interposer metallization layer comprising one or more first interposer metal interconnects each coupled to the first vertical interconnect among the plurality of first vertical interconnects, to couple each first interposer metal interconnect among the one or more first interposer metal interconnects to each first substrate metal interconnect among the one or more first substrate metal interconnects.

11. The multi-die IC package of any of clauses 8-9, wherein:
    the first package substrate comprises a first substrate metallization layer comprising one or more first substrate metal interconnects each coupled to a first vertical interconnect among the plurality of first vertical interconnects;
    the first interposer substrate comprises a first interposer metallization layer comprising one or more first interposer metal interconnects each coupled to the first vertical interconnect among the plurality of first vertical interconnects, to couple each first interposer metal interconnect among the one or more first interposer metal interconnects to each first substrate metal interconnect among the one or more first substrate metal interconnects;
    the second package substrate comprises a second substrate metallization layer comprising one or more second substrate metal interconnects each coupled to a second vertical interconnect among the plurality of second vertical interconnects; and
    the second interposer substrate comprises a second interposer metallization layer comprising one or more second interposer metal interconnects each coupled to the second vertical interconnect among the plurality of second vertical interconnects, to couple each second interposer metal interconnect among the one or more second interposer metal interconnects to each second substrate metal interconnect among the one or more second substrate metal interconnects.

12. The multi-die IC package of any of clauses 1-11, further comprising a plurality of interconnect bumps coupled to the first die package and the second die package;
    the plurality of interconnect bumps each coupling a first vertical interconnect among the plurality of first vertical interconnects in the first die package, to a second vertical interconnect among the plurality of first vertical interconnects in the second die package.

13. The multi-die IC package of clause 12, further comprising a cavity formed between the first die package and the second die package, the plurality of interconnect bumps disposed in the cavity.

14. The multi-die IC package of clause 13, further comprising a thermally-conductive material disposed in the cavity.

15. The multi-die IC package of any of clauses MA, wherein:
    the first die comprises a first active side adjacent to the first package substrate;
    the second die comprises a second active side adjacent to the second package substrate;
    the first die further comprises a first inactive side; and
    the second die further comprises a second inactive side adjacent to the first inactive side.

16. The multi-die IC package of any of clauses 1-14, wherein:
  the first die comprises a first active side adjacent to the first package substrate;
  the second die comprises a second inactive side adjacent to the second package substrate;
  the first die further comprises a first inactive side; and
  the second die further comprises a second active side adjacent to the first inactive side.
17. The multi-die IC package of clause 1, wherein:
  the first die comprises a first inactive side adjacent to the first package substrate; and
  the second die comprises a second active side adjacent to the second package substrate;
  the second die further comprises a second inactive side; and
  the first die further comprises a second active side adjacent to the second inactive side.
18. The multi-die IC package of any of clauses 1-17, further comprising:
  a third die package adjacent to the second die package in the vertical direction, the third die package comprising:
    a third package substrate coupled to the second die package; and
    a third die adjacent to the third package substrate in the vertical direction, the third die coupled to the third package substrate.
19. The multi-die IC package of clause 18, wherein:
  the second package substrate comprises a second substrate metallization layer comprising one or more second substrate metal interconnects each coupled to a second vertical interconnect among the plurality of second vertical interconnects; and
  the third package substrate comprises a third substrate metallization layer comprising one or more third substrate metal interconnects each coupled to a second substrate metal interconnect among the one or more second substrate metal interconnects, to couple the one or more third substrate metal interconnects to one or more of the plurality of second vertical interconnects.
20. The multi-die IC package of any of clauses 1-19, wherein:
  the plurality of first vertical interconnects comprise a plurality of first metal pillars; and
  the plurality of second vertical interconnects comprise a plurality of second metal pillars.
21. The multi-die IC package of any of clauses 1-19, wherein:
  the first die package comprising a first molding material,
    the first die disposed in the first molding material; and
    the plurality of first vertical interconnects comprising a plurality of first through-mold vertical interconnect accesses (vias) (TMVs) disposed in the first molding material;
  the second die package comprising a second molding material,
    the second die disposed in the second molding material; and
    the plurality of second vertical interconnects comprising a plurality of second TMVs disposed in the second molding material.
22. The multi-die IC package of any of clauses 1-21 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
23. A method of fabricating a multiple (multi-) die integrated circuit (IC) package, comprising:
  forming a first die package, comprising:
    providing a first package substrate;
    providing a first die;
    coupling the first die to the first package substrate in a vertical direction; and
    forming a plurality of first vertical interconnects coupled to the first package substrate and disposed adjacent to the first die in a horizontal direction; and
  forming a second die package, comprising:
    providing a second package substrate;
    providing a second die;
    coupling the second die to the second package substrate in the vertical direction; and
    forming a plurality of second vertical interconnects coupled to the second package substrate and disposed adjacent to the second die in the horizontal direction; and
  coupling the second die package to the first die package in the vertical direction.
24. The method of clause 23, further comprising:
  not forming a through-silicon vertical interconnect access (via) (TSV) through the first die; and
  not forming a TSV through the second die.
25. The method of any of clauses 23-24, wherein forming first die package further comprises:
  providing a first interposer substrate;
  coupling the first die to a first interposer, the first die coupled between the first interposer substrate and the first package substrate in the vertical direction; and
  coupling each of the plurality of first vertical interconnects to the first interposer substrate.
26. The method of clause 25, wherein forming second die package further comprises:
  providing a second interposer substrate
  coupling the second interposer substrate to the second die, the second die disposed between the second interposer substrate and the second package substrate in the vertical direction; and
  coupling each of the plurality of second vertical interconnects to the second interposer substrate.
27. The method of any of clauses 23-26, coupling the second die package to the first die package in the vertical direction comprises:
  coupling the first die package to a plurality of interconnect bumps; and
  coupling the second die package to the plurality of interconnect bumps such that the plurality of interconnect bumps is disposed between the first die package and the second die package in the vertical direction.
28. The method of clause 27, wherein coupling the first die package and the second die package to the plurality of interconnect bumps forms a cavity between the first die package and the second die package, wherein the plurality of interconnect bumps is disposed in the cavity.

29. The method of clause 28, further comprising disposing a thermally-conductive material disposed in the cavity.

30. The method of any of clauses 23-29, further comprising:
forming a third die package, comprising:
providing a third package substrate;
providing a third die; and
coupling the third die to the third package substrate in the vertical direction; and
coupling the third package substrate to one or more second vertical interconnects among the plurality of second vertical interconnects in the second die package.

31. The method of any of clauses 23-30, wherein:
forming the first die package comprises forming the plurality of first vertical interconnects coupled to the first package substrate before coupling the first die to the first package substrate; and
forming the second die package comprises forming the plurality of second vertical interconnects coupled to the second package substrate before coupling the second die to the second package substrate; and 32. The method of any of clauses 23-30, wherein:
forming the first die package comprises coupling the first die to the first package substrate before forming the plurality of first vertical interconnects coupled to the first package substrate; and
forming the second die package comprises coupling the second die to the second package substrate before forming the plurality of second vertical interconnects coupled to the second package substrate.

33. The method of clause 32, wherein:
forming the plurality of first vertical interconnects coupled to the first package substrate, comprises:
forming a first package mold on the first package substrate and the first die;
patterning the first package mold to form a first plurality of openings in the first package mold adjacent to the first die;
forming the plurality of first vertical interconnects in the first plurality of openings; and
coupling the plurality of first vertical interconnects in the first plurality of openings to the first package substrate; and
forming the plurality of second vertical interconnects coupled to the second package substrate, comprises:
forming a second package mold on the second package substrate and the second die;
patterning the second package mold to form a second plurality of openings in the second package mold adjacent to the second die;
forming the plurality of second vertical interconnects in the second plurality of openings; and
coupling the plurality of second vertical interconnects in the second plurality of openings to the second package substrate.

34. The method of any of clauses 23-30, further comprising:
forming a first back side metallization layer comprising a plurality of first metal interconnects adjacent to the first package substrate; and
forming a second back side metallization layer comprising a plurality of second metal interconnects adjacent to the second package substrate;
wherein:
forming the plurality of first vertical interconnects comprises forming the plurality of first vertical interconnects each coupled to a first metal interconnect among the plurality of first metal interconnects in the first back side metallization layer; and
forming the plurality of second vertical interconnects comprises forming the plurality of second vertical interconnects each coupled to a second metal interconnect among the plurality of second metal interconnects in the second back side metallization layer.

35. The method of clause 34, wherein:
coupling the first die comprises coupling a first inactive side of the first die to the first back side metallization layer in the vertical direction; and
coupling the second die comprises coupling a second inactive side of the second die to the second back side metallization layer in the vertical direction.

36. The method of any of clauses 34-35, wherein:
providing the first package substrate further comprises forming a first front side metallization layer comprising a plurality of third metal interconnects adjacent to a first active side of the first die;
coupling the first die to the first package substrate comprises coupling the first die to one or more third metal interconnects among the plurality of third metal interconnects in the vertical direction;
providing the second package substrate further comprises forming a second front side metallization layer comprising a plurality of fourth metal interconnects adjacent to a second active side of the second die; and
coupling the second die to the second package substrate comprises coupling the second die to one or more fourth metal interconnects among the plurality of fourth metal interconnects in the vertical direction; and
further comprising:
coupling the plurality of first vertical interconnects to one or more other third metal interconnects among the plurality of third metal interconnects; and
coupling the plurality of second vertical interconnects to one or more other fourth metal interconnects among the plurality of fourth metal interconnects.

The method of any of clauses 23-30, wherein:
providing the first package substrate further comprises forming a first front side metallization layer comprising a plurality of first metal interconnects;
forming the plurality of first vertical interconnects comprises forming the plurality of first vertical interconnects each coupled to a first metal interconnect among the plurality of first metal interconnects in the first front side metallization layer;
providing the second package substrate further comprises forming a second front side metallization layer comprising a plurality of second metal interconnects;
forming the plurality of second vertical interconnects comprises forming the plurality of second vertical interconnects each coupled to a second metal interconnect among the plurality of second metal interconnects in the second front side metallization layer.

38. The method of clause 37, wherein:
coupling the first die comprises coupling a first active side of the first die to the first front side metallization layer in the vertical direction; and
coupling the second die comprises coupling a second active side of the second die to the second front side metallization layer in the vertical direction.

39. The method of any of clauses 37-38, further comprising:
forming a first back side metallization layer comprising a plurality of third metal interconnects adjacent to a first inactive side of the first die;

coupling the first die to one or more third metal interconnects among the plurality of third metal interconnects in the vertical direction;
forming a second back side metallization layer comprising a plurality of fourth metal interconnects adjacent to a second inactive side of the second die;
coupling the second die to one or more fourth metal interconnects among the plurality of fourth metal interconnects in the vertical direction;
further comprising:
coupling the plurality of first vertical interconnects to one or more other third metal interconnects among the plurality of third metal interconnects; and
coupling the plurality of second vertical interconnects to one or more other fourth metal interconnects among the plurality of fourth metal interconnects.

What is claimed is:

1. A multiple (multi-) die integrated circuit (IC) package, comprising:
a first die package, comprising:
a first package substrate;
a first die coupled to the first package substrate; and
a plurality of first vertical interconnects disposed adjacent to the first die in a horizontal direction,
each of the plurality of first vertical interconnects coupled to the first package substrate, and
one or more first vertical interconnects of the plurality of first vertical interconnects coupled to the first die;
the first die package further comprises a first interposer substrate disposed adjacent to the first die, the first die disposed between the first interposer substrate and the first package substrate in the vertical direction; and
each of the plurality of first vertical interconnects is coupled to the first interposer substrate;
a second die package adjacent to the first die package in a vertical direction orthogonal to the horizontal direction, the second die package comprising:
a second package substrate;
a second die coupled to the second package substrate; and
a plurality of second vertical interconnects disposed adjacent to the second die in the horizontal direction,
each of the plurality of second vertical interconnects coupled to the second package substrate, and
one or more second vertical interconnects of the plurality of second vertical interconnects coupled to the second die and coupled to the one or more first vertical interconnects coupled to the first die to couple the second die to the first die;
a cavity between the first die package and the second die package; and
a plurality of interconnect bumps disposed in the cavity and each coupled to a first vertical interconnect of the plurality of first vertical interconnects and a second vertical interconnect of the plurality of second vertical interconnect.

2. The multi-die IC package of claim 1, further not comprising a through-silicon vertical interconnect access (via) (TSV) disposed through the first die and disposed through the second die.

3. The multi-die IC package of claim 1, wherein:
the first die is adjacent to the first package substrate in the vertical direction; and
the second die is adjacent to the second package substrate in the vertical direction.

4. The multi-die IC package of claim 1, wherein:
the first package substrate comprises a first substrate metallization layer comprising one or more first substrate metal interconnects each coupled to a first vertical interconnect of the one or more first vertical interconnects;
the first die comprises one or more first die interconnects each coupled to a first substrate metal interconnect among the one or more first substrate metal interconnects, to couple the one or more first die interconnects to the one or more first vertical interconnects;
the second package substrate comprises a second substrate metallization layer comprising one or more second substrate metal interconnects each coupled to a second vertical interconnect of the one or more second vertical interconnects; and
the second die comprises one or more second die interconnects each coupled to a second substrate metal interconnect among the one or more second substrate metal interconnects, to couple one or more second die interconnects to the one or more second vertical interconnects.

5. The multi-die IC package of claim 4, wherein:
the first substrate metallization layer comprises a first substrate redistribution layer (RDL) comprising the one or more first substrate metal interconnects comprising one or more first RDL interconnects; and
the second substrate metallization layer comprises a second substrate RDL comprising the one or more second substrate metal interconnects comprising one or more second RDL interconnects.

6. The multi-die IC package of claim 1, wherein the first die is additionally coupled to the first interposer substrate.

7. The multi-die IC package of claim 1, wherein:
the second die package further comprises a second interposer substrate disposed adjacent to the second die, the second die disposed between the second interposer substrate and the second package substrate in the vertical direction; and
each of the plurality of second vertical interconnects is coupled to the second interposer substrate.

8. The multi-die IC package of claim 7, wherein the second die is additionally coupled to the second interposer substrate.

9. The multi-die IC package of claim 1, wherein:
the first package substrate comprises a first substrate metallization layer comprising one or more first substrate metal interconnects each coupled to a first vertical interconnect among the plurality of first vertical interconnects; and
the first interposer substrate comprises a first interposer metallization layer comprising one or more first interposer metal interconnects each coupled to the first vertical interconnect among the plurality of first vertical interconnects, to couple each first interposer metal interconnect among the one or more first interposer metal interconnects to each first substrate metal interconnect among the one or more first substrate metal interconnects.

10. The multi-die IC package of claim 7, wherein:
the first package substrate comprises a first substrate metallization layer comprising one or more first substrate metal interconnects each coupled to a first vertical interconnect among the plurality of first vertical interconnects;
the first interposer substrate comprises a first interposer metallization layer comprising one or more first interposer metal interconnects each coupled to the first vertical interconnect among the plurality of first vertical interconnects, to couple each first interposer metal interconnect among the one or more first interposer metal interconnects to each first substrate metal interconnect among the one or more first substrate metal interconnects;

the second package substrate comprises a second substrate metallization layer comprising one or more second substrate metal interconnects each coupled to a second vertical interconnect among the plurality of second vertical interconnects; and the second interposer substrate comprises a second interposer metallization layer comprising one or more second interposer metal interconnects each coupled to the second vertical interconnect among the plurality of second vertical interconnects, to couple each second interposer metal interconnect among the one or more second interposer metal interconnects to each second substrate metal interconnect among the one or more second substrate metal interconnects.

11. The multi-die IC package of claim 1, further comprising a thermally-conductive material disposed in the cavity.

12. The multi-die IC package of claim 1, wherein:
the first die comprises a first active side adjacent to the first package substrate;
the second die comprises a second active side adjacent to the second package substrate;
the first die further comprises a first inactive side; and
the second die further comprises a second inactive side adjacent to the first inactive side.

13. The multi-die IC package of claim 1, wherein:
the first die comprises a first active side adjacent to the first package substrate;
the second die comprises a second inactive side adjacent to the second package substrate;
the first die further comprises a first inactive side; and
the second die further comprises a second active side adjacent to the first inactive side.

14. The multi-die IC package of claim 1, wherein:
the first die comprises a first inactive side adjacent to the first package substrate;
the second die comprises a second active side adjacent to the second package substrate;
the second die further comprises a second inactive side; and
the first die further comprises a second active side adjacent to the second inactive side.

15. The multi-die IC package of claim 1, further comprising:
a third die package adjacent to the second die package in the vertical direction, the third die package comprising:
a third package substrate coupled to the second die package; and
a third die adjacent to the third package substrate in the vertical direction, the third die coupled to the third package substrate.

16. The multi-die IC package of claim 15, wherein:
the second package substrate comprises a second substrate metallization layer comprising one or more second substrate metal interconnects each coupled to a second vertical interconnect among the plurality of second vertical interconnects; and
the third package substrate comprises a third substrate metallization layer comprising one or more third substrate metal interconnects each coupled to a second substrate metal interconnect among the one or more second substrate metal interconnects, to couple the one or more third substrate metal interconnects to one or more of the plurality of second vertical interconnects.

17. The multi-die IC package of claim 1, wherein:
the plurality of first vertical interconnects comprise a plurality of first metal pillars; and
the plurality of second vertical interconnects comprise a plurality of second metal pillars.

18. The multi-die IC package of claim 1, wherein:
the first die package comprises a first molding material,
the first die disposed in the first molding material; and
the plurality of first vertical interconnects comprising a plurality of first through-mold vertical interconnect accesses (vias) (TMVs) disposed in the first molding material; and
the second die package comprises a second molding material,
the second die disposed in the second molding material; and
the plurality of second vertical interconnects comprising a plurality of second TMVs disposed in the second molding material.

19. The multi-die IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A method of fabricating a multiple (multi-) die integrated circuit (IC) package, comprising:
forming a first die package, comprising:
providing a first package substrate;
providing a first die;
coupling the first die to the first package substrate in a vertical direction;
forming a plurality of first vertical interconnects coupled to the first package substrate and disposed adjacent to the first die in a horizontal direction; and
coupling one or more first vertical interconnects of the plurality of first vertical interconnects to the first die;
providing a first interposer substrate;
coupling the first die to the first interposer substrate, the first die coupled between the first interposer substrate and the first package substrate in the vertical direction; and
coupling each of the plurality of first vertical interconnects to the first interposer substrate;
forming a second die package, comprising:
providing a second package substrate;
providing a second die;
coupling the second die to the second package substrate in the vertical direction;
forming a plurality of second vertical interconnects coupled to the second package substrate and disposed adjacent to the second die in the horizontal direction; and coupling one or more second vertical interconnects of the plurality of second vertical interconnects to the second die;

forming one or more interconnect bumps each coupled to a first vertical interconnect of the one or more first vertical interconnects; and coupling the second die package to the first die package in the vertical direction by coupling the one or more second vertical interconnects to the one or more interconnect bumps in a cavity between the second die package and the first die package in the vertical direction, to couple the second die to the first die.

21. The method of claim 20, further comprising:
not forming a through-silicon vertical interconnect access (via) (TSV) through the first die; and
not forming a TSV through the second die.

22. The method of claim 20, wherein forming the second die package further comprises:
providing a second interposer substrate;
coupling the second interposer substrate to the second die, the second die disposed between the second interposer substrate and the second package substrate in the vertical direction; and
coupling each of the plurality of second vertical interconnects to the second interposer substrate.

23. The method of claim 20, further comprising disposing a thermally-conductive material disposed in the cavity.

24. The method of claim 20, further comprising:
forming a third die package, comprising:
providing a third package substrate;
providing a third die; and
coupling the third die to the third package substrate in the vertical direction; and
coupling the third package substrate to the one or more second vertical interconnects among the plurality of second vertical interconnects in the second die package.

25. The method of claim 20, wherein:
forming the first die package comprises forming the plurality of first vertical interconnects coupled to the first package substrate before coupling the first die to the first package substrate; and
forming the second die package comprises forming the plurality of second vertical interconnects coupled to the second package substrate before coupling the second die to the second package substrate.

26. The method of claim 20, wherein:
forming the first die package comprises coupling the first die to the first package substrate before forming the plurality of first vertical interconnects coupled to the first package substrate; and
forming the second die package comprises coupling the second die to the second package substrate before forming the plurality of second vertical interconnects coupled to the second package substrate.

27. The method of claim 26, wherein:
forming the plurality of first vertical interconnects coupled to the first package substrate, comprises:
forming a first package mold on the first package substrate and the first die;
patterning the first package mold to form a first plurality of openings in the first package mold adjacent to the first die;
forming the plurality of first vertical interconnects in the first plurality of openings; and coupling the plurality of first vertical interconnects in the first plurality of openings to the first package substrate; and
forming the plurality of second vertical interconnects coupled to the second package substrate, comprises:
forming a second package mold on the second package substrate and the second die;
patterning the second package mold to form a second plurality of openings in the second package mold adjacent to the second die;
forming the plurality of second vertical interconnects in the second plurality of openings; and
coupling the plurality of second vertical interconnects in the second plurality of openings to the second package substrate.

28. The method of claim 20, further comprising:
forming a first back side metallization layer comprising a plurality of first metal interconnects adjacent to the first package substrate; and
forming a second back side metallization layer comprising a plurality of second metal interconnects adjacent to the second package substrate;
wherein:
forming the plurality of first vertical interconnects further comprises forming the plurality of first vertical interconnects each coupled to a first metal interconnect among the plurality of first metal interconnects in the first back side metallization layer; and
forming the plurality of second vertical interconnects comprises forming the plurality of second vertical interconnects each coupled to a second metal interconnect among the plurality of second metal interconnects in the second back side metallization layer.

29. The method of claim 28, wherein:
coupling the first die comprises coupling a first inactive side of the first die to the first back side metallization layer in the vertical direction; and
coupling the second die comprises coupling a second inactive side of the second die to the second back side metallization layer in the vertical direction.

30. The method of claim 28, wherein:
providing the first package substrate further comprises forming a first front side metallization layer comprising a plurality of third metal interconnects adjacent to a first active side of the first die;
coupling the first die to the first package substrate comprises coupling the first die to one or more third metal interconnects among the plurality of third metal interconnects in the vertical direction;
providing the second package substrate further comprises forming a second front side metallization layer comprising a plurality of fourth metal interconnects adjacent to a second active side of the second die; and
coupling the second die to the second package substrate comprises coupling the second die to one or more fourth metal interconnects among the plurality of fourth metal interconnects in the vertical direction; and
further comprising:
coupling the one or more first vertical interconnects to one or more other third metal interconnects among the plurality of third metal interconnects; and
coupling the one or more second vertical interconnects to one or more other fourth metal interconnects among the plurality of fourth metal interconnects.

31. The method of claim 20, wherein:
providing the first package substrate further comprises forming a first front side metallization layer comprising a plurality of first metal interconnects;
forming the plurality of first vertical interconnects comprises forming the plurality of first vertical interconnects each coupled to a first metal interconnect among the plurality of first metal interconnects in the first front side metallization layer;
providing the second package substrate further comprises forming a second front side metallization layer comprising a plurality of second metal interconnects;
forming the plurality of second vertical interconnects comprises forming the plurality of second vertical interconnects each coupled to a second metal interconnect among the plurality of second metal interconnects in the second front side metallization layer.

32. The method of claim 31, wherein:
coupling the first die comprises coupling a first active side of the first die to the first front side metallization layer in the vertical direction; and
coupling the second die comprises coupling a second active side of the second die to the second front side metallization layer in the vertical direction.

33. The method of claim 31, further comprising:
forming a first back side metallization layer comprising a plurality of third metal interconnects adjacent to a first inactive side of the first die;
coupling the first die to one or more third metal interconnects among the plurality of third metal interconnects in the vertical direction;
forming a second back side metallization layer comprising a plurality of fourth metal interconnects adjacent to a second inactive side of the second die;
coupling the second die to one or more fourth metal interconnects among the plurality of fourth metal interconnects in the vertical direction;
further comprising:
coupling the one or more first vertical interconnects to one or more other third metal interconnects among the plurality of third metal interconnects; and
coupling the one or more second vertical interconnects to one or more other fourth metal interconnects among the plurality of fourth metal interconnects.

* * * * *